(12) United States Patent
Anpo et al.

(10) Patent No.: US 7,698,682 B2
(45) Date of Patent: Apr. 13, 2010

(54) WRITING ERROR VERIFICATION METHOD OF PATTERN WRITING APPARATUS AND GENERATION APPARATUS OF WRITING ERROR VERIFICATION DATA FOR PATTERN WRITING APPARATUS

(75) Inventors: Akihito Anpo, Tokyo (JP); Jun Kasahara, Kanagawa (JP); Hitoshi Higurashi, Kanagawa (JP); Shigehiro Hara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 259 days.

(21) Appl. No.: 11/838,542

(22) Filed: Aug. 14, 2007

(65) Prior Publication Data
US 2008/0046787 A1 Feb. 21, 2008

(30) Foreign Application Priority Data
Aug. 17, 2006 (JP) .............................. 2006-222280

(51) Int. Cl.
*G06F 17/50* (2006.01)
*G06F 9/45* (2006.01)

(52) U.S. Cl. ............................................. 716/21; 716/5

(58) Field of Classification Search .................. None
See application file for complete search history.

(56) References Cited

U.S. PATENT DOCUMENTS
7,530,049 B2 * 5/2009 Kobayashi et al. ............ 716/19

FOREIGN PATENT DOCUMENTS
JP 5-249651 9/1993

* cited by examiner

*Primary Examiner*—Leigh Marie Garbowski
(74) *Attorney, Agent, or Firm*—Oblon, Spivak, McClelland, Maier & Neustadt, L.L.P.

(57) ABSTRACT

A generation apparatus of writing error verification data for a pattern writing apparatus includes a data extraction part configured to extract, from layout data including a figure pattern to be written, part of the layout data required for an operation of a function having a writing error occurred after starting writing by the pattern writing apparatus which performs writing on a target workpiece based on the layout data, and a verification data generation part configured to perform a merge process based on extracted part of the layout data, and to generate writing error verification data, for which the merge process has been performed, for verifying the writing error of the pattern writing apparatus.

11 Claims, 22 Drawing Sheets

WRITING ERROR VERIFICATION METHOD OF PATTERN WRITING APPARATUS AND GENERATION APPARATUS OF WRITING ERROR VERIFICATION DATA FOR PATTERN WRITING APPARATUS

CROSS-REFERENCE TO RELATED APPLICATION

This application is based upon and claims the benefit of priority from the prior Japanese Patent Application No. 2006-222280 filed on Aug. 17, 2006 in Japan, the entire contents of which are incorporated herein by reference.

BACKGROUND OF THE INVENTION

1. Field of the Invention

The present invention relates to an operation error verification method for a pattern writing apparatus, and a generation apparatus of operation error verification data for a pattern writing apparatus. For example, it relates to an operation error verification method for an electron beam pattern writing apparatus, and a generation apparatus of operation error verification data for an electron beam pattern writing apparatus.

2. Description of Related Art

Microlithography technology which forwards miniaturization of semiconductor devices is extremely important, because only this process performs forming a pattern in semiconductor manufacturing processes. In recent years, with an increase in high integration and large capacity of LSI, a critical dimension of a circuit required for semiconductor elements is becoming narrower and narrower. In order to form a desired circuit pattern on these semiconductor devices, a high precision master pattern (also called a mask or a reticle) is needed. Then, as the electron beam technology for writing or "drawing" a pattern has excellent resolution intrinsically, it is used for manufacturing such high precision master patterns.

FIG. 22 shows a schematic diagram for explaining operations of a conventional variable-shaped electron beam pattern writing apparatus. The variable-shaped electron beam (EB) pattern writing apparatus operates as follows. As shown in the figure, the pattern writing apparatus includes two aperture plates. A first or "upper" aperture plate 410 has an opening or "hole" 411 in the shape of a rectangle for shaping an electron beam 442. This shape of the rectangular opening may also be a square, a rhombus, a rhomboid, etc. A second or "lower" aperture plate 420 has a specially shaped opening 421 for shaping the electron beam 442 having passed through the opening 411 of the first aperture plate 410 into a desired rectangle. The electron beam 442 that left a charged particle source 430 and has passed through the opening 411 is deflected by a deflector. Then, the electron beam 442 passes through part of the specially shaped opening 421 of the second aperture plate 420, and reaches a target workpiece 440 mounted on a stage that is continuously moving in a predetermined direction (e.g. X-axis direction). In other words, a rectangular shape capable of passing through both of the opening 411 and the specially shaped opening 421 is written or "drawn" in a pattern writing area of the target workpiece 440 mounted on the stage. This method of writing or "forming" a given variable shape by letting beams pass through both of the opening 411 and the specially shaped opening 421 is called a variable shaped beam system.

When performing electron beam writing or "drawing", first, the layout of a semiconductor integrated circuit is designed and its layout data is generated. Then, data of the chips satisfying some conditions in the layout data is merged to reconstruct the layout data. This process is defined as a chip merge process. The layout data for which the chip merge process has been performed is converted to generate writing data used in the electron beam pattern writing apparatus. Based on the writing data, a figure is divided into a shot size for actually shooting electron beams to write.

As a technique for generating exposure data to be input into an exposure apparatus (pattern writing apparatus), serving as a pre-step in manufacturing a mask, the following is disclosed: First, design data is divided into a plurality of processing units to perform parallel processing. Then, if an error arises in data conversion in one of the parallel processing, reprocessing is performed only for the data in which the error occurred, and data normally converted is used as it is. (Refer to, e.g., Japanese Published Unexamined Patent Application No. 5-249651 (JP-A-5-249651))

In this case, a writing error may be generated during the procedure from inputting the layout data into the pattern writing apparatus to inspecting the target workpiece on which a figure pattern has been written. If such a writing error arises when starting writing by the pattern writing apparatus, the easiest method for performing reproduction for inspection is to use completely the same data. However, if the processing time from starting writing to finding out an error generation point is long, there is a problem that the inspection of the error takes extremely long time.

BRIEF SUMMARY OF THE INVENTION

It is an object of the present invention to shorten the time for inspecting errors.

In accordance with one aspect of the present invention, a generation apparatus of writing error verification data for a pattern writing apparatus includes a data extraction part configured to extract, from layout data including a figure pattern to be written, part of the layout data required for an operation of a function having a writing error occurred after starting writing by the pattern writing apparatus which performs writing on a target workpiece based on the layout data, and a verification data generation part configured to perform a merge process based on extracted part of the layout data, and to generate writing error verification data, for which the merge process has been performed, for verifying the writing error of the pattern writing apparatus.

In accordance with another aspect of the present invention, a writing error verification method of a pattern writing apparatus includes extracting part of layout data required for an operation of a function having a writing error from the layout data, when the writing error occurs during a procedure from inputting the layout data, which includes a figure pattern to be written, into the pattern writing apparatus that writes the figure pattern on a target workpiece based on the layout data, to inspecting the target workpiece on which the figure pattern has been written, and reproducing the operation of the function having the writing error based on extracted part of the layout data, and outputting a result of the reproducing.

DETAILED DESCRIPTION OF THE INVENTION

In the following Embodiments, the structure of a charged particle beam pattern writing apparatus as an example of a pattern writing apparatus, especially the structure utilizing an electron beam as an example of a charged particle beam will be described. The charged particle beam is not restricted to the electron beam, and then may be a beam using other charged particle, such as an ion beam.

Embodiment 1

Figure 1:
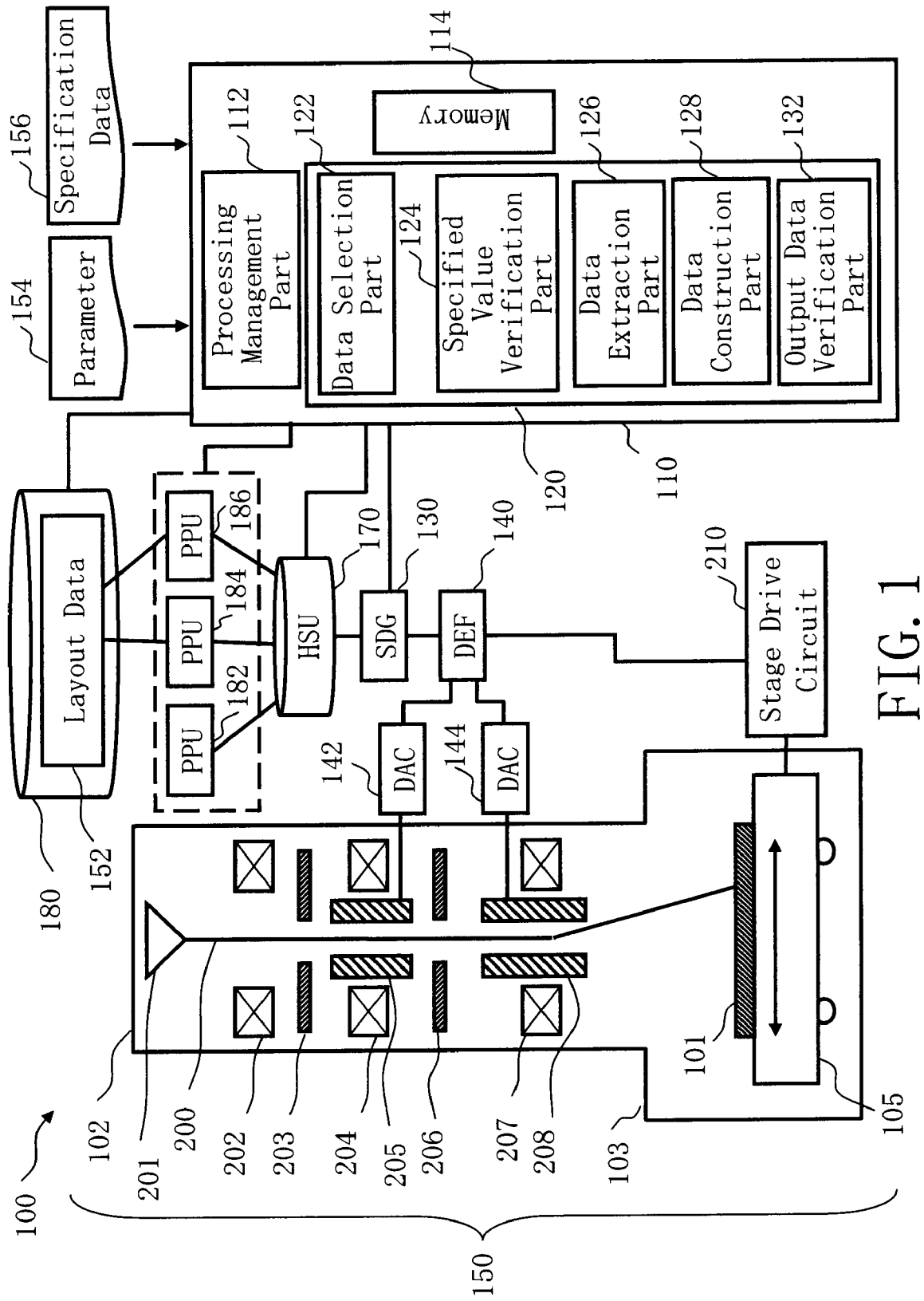
FIG. 1 is a schematic diagram showing the structure of a pattern writing apparatus described in Embodiment 1.

FIG. 1 is a schematic diagram showing the structure of a pattern writing apparatus described in Embodiment 1. In the figure, a pattern writing apparatus 100 serving as an example of a charged particle beam pattern writing apparatus includes a pattern writing part 150 and a control system. The pattern writing apparatus 100 writes or "draws" a figure pattern on a target workpiece 101, based on layout data including a plurality of figure patterns. The target workpiece 101 includes a mask to be used for manufacturing semiconductor devices.

The pattern writing part 150 includes an electron lens barrel 102 and a writing chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the writing chamber 103, an XY stage 105 is arranged. On the XY stage 105, the target workpiece 101 to be written is laid or "placed".

The control system includes a writing control unit (WCU) 110, a shot data generating unit (SDG) 130, a deflection control circuit (DEF) 140, a digital analog converter (DAC) 142, a DAC 144, a high-speed shared storage unit (HSU) 170, a data storage unit (DSU) 180, a parallel processing unit (PPU) 182, a PPU 184, a PPU 186, and a stage drive circuit 210.

The writing control unit 110 includes a processing management part 112, a memory 114, and an evaluation data generation part 120 (an example of a generation apparatus of operation error verification data for the pattern writing apparatus 100). The evaluation data generation part 120 includes a data selection part 122, a specified value verification part 124, a data extraction part 126, a data construction part 128, and an output data verification part 132. In the present case, as an example, the evaluation data generation part 120, which is comprised of a control calculator being a computer, includes functions, such as the data selection part 122, the specified value verification part 124, the data extraction part 126, the data construction part 128, and the output data verification part 132. Then, input data or output data processed in the evaluation data generation part 120 is stored in the memory 114.

Each of the functions of the data selection part 122, the specified value verification part 124, the data extraction part 126, the data construction part 128, the output data verification part 132, etc. is configured by software whose processing is executed by a computer. However, it should not be limited thereto. For example, they may be configured by hardware of an electric circuit. Alternatively, they may be executed by a combination of hardware of an electric circuit and software, or a combination of hardware and firmware. Moreover, the processing management part 112 may also be comprised of a control calculator being a computer.

Moreover, the shot data generating unit 130, the PPU 182, the PPU 184, and the PPU 186 include CPUs (not shown) serving as computers.

To the writing control unit 110, the shot data generating unit 130, the high-speed shared storage unit 170, the data storage unit 180, the PPU 182, the PPU 184, and the PPU 186 are connected through buses. To the shot data generating unit 130, the writing control unit 110, the deflection control circuit 140 and the high-speed shared storage unit 170 are connected through buses. To the deflection control circuit 140, the DAC 142, the DAC 144, and the stage drive circuit 210 are connected through buses. Furthermore, the DAC 142 is connected to the deflector 205 and the DAC 144 is connected to the deflector 208. Layout data 152 input from a customer server apparatus, for which a chip merge process has been performed or has not been performed, is stored in the data storage unit 180.

FIG. 1 depicts structure elements necessary for describing Embodiment 1, and description of other structure elements not necessary for explaining Embodiment 1 is omitted. However, it should be understood that structure elements usually required for the pattern writing apparatus 100 could be included. Moreover, although three parallel processing units (PPUs) are shown in FIG. 1, what is necessary is just one or more, and the number of the units is not limited.

An electron beam 200, leaving the electron gun assembly 201, is irradiated or "shot" by the illumination lens 202 onto the whole of the first aperture plate 203 having a rectangular opening, for example. At this point, the electron beam 200 is shaped to be a desired rectangle, for example. Then, after having passed through the first aperture plate 203, the electron beam 200 of a first aperture image is guided by the projection lens 204 to reach the second aperture plate 206. The position of the first aperture image on the second aperture plate 206 is deflected/controlled by the deflector 205 which is controlled by the deflection control circuit 140 through the DAC 142. Thus, the shape and the size of the beam can be changed. After having passed through the second aperture plate 206, the electron beam 200 of a second aperture image is focus-adjusted by the objective lens 207 and deflected by the deflector 208 which is controlled by the deflection control circuit 140 through the DAC 144, to reach a desired position on the target workpiece 101 placed on the XY stage 105. The XY stage 105 is movably controlled in the X direction and the Y direction by the stage drive circuit 210.

The inside of the electron lens barrel 102 and the writing chamber 103 is exhausted by a vacuum pump (not shown), and is controlled to be a pressure lower than atmospheric pressure.

Since the writing control unit 110, and especially the processing management part 112 control each unit apparatus, such as the shot data generating unit 130, the high-speed shared storage unit 170, the data storage unit 180, the PPU 182, the PPU 184, and the PPU 186, the whole of the pattern writing apparatus 100 can be controlled.

Figure 2:
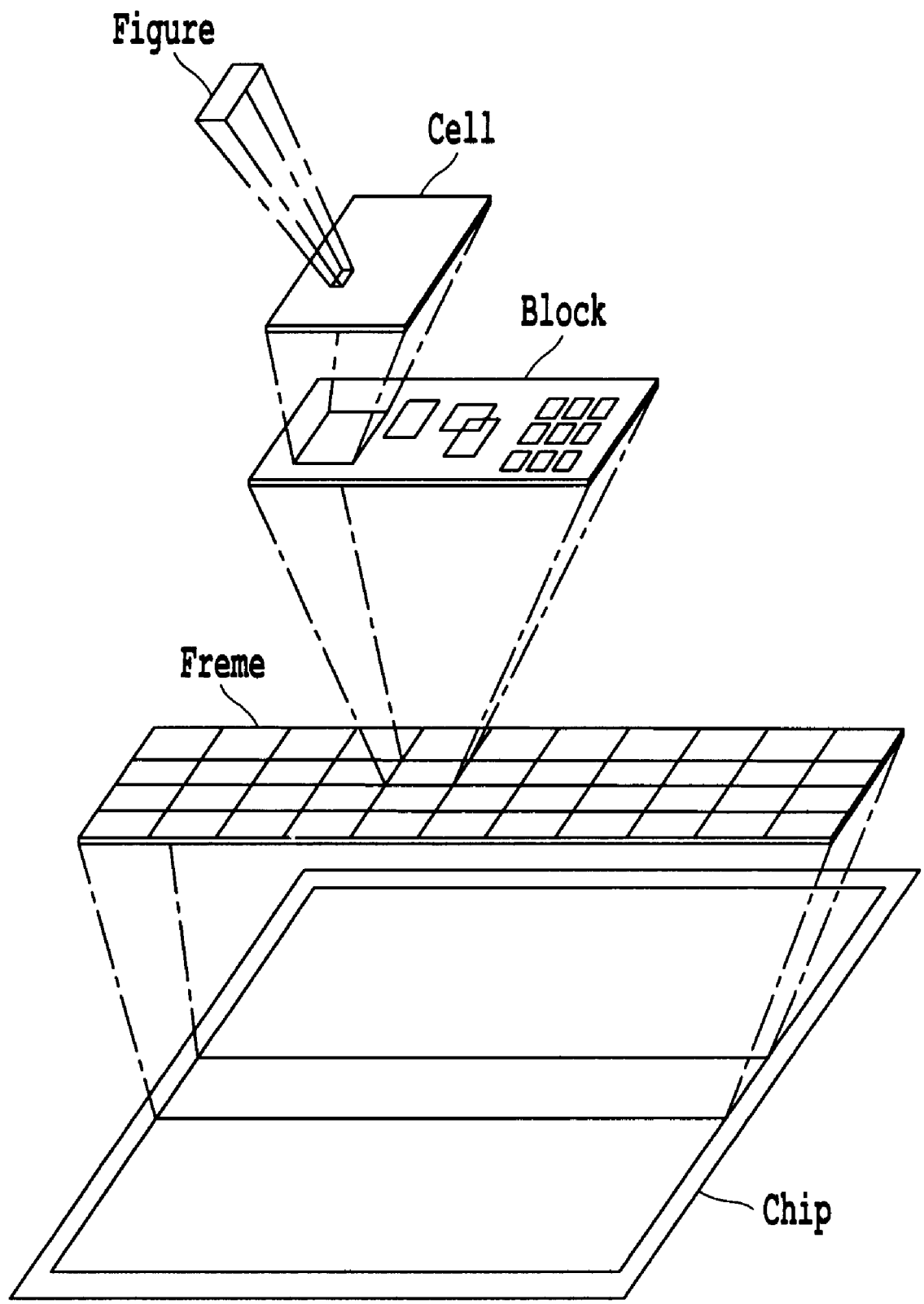
FIG. 2 shows an example of a hierarchical structure of layout data.

FIG. 2 shows an example of a hierarchical structure of layout data. In the layout data, as shown in FIG. 2, a pattern writing area or "range" has a hierarchical structure composed of a series of plural internal structure units, such as the layer of a chip, the layer of a frame, the layer of a block, the layer of a cell, and the layer of a figure. The layer of a frame is formed by dividing a chip area into a plurality of strip-like portions in the Y direction, for example. The layer of a block is formed by dividing a frame. The layer of a cell is composed of at least one or more figures. The layer of a figure composes a cell. Moreover, it is general for the layout data that a plurality of chip layers are laid out in one writing area of the target workpiece 101.

Figure 3:
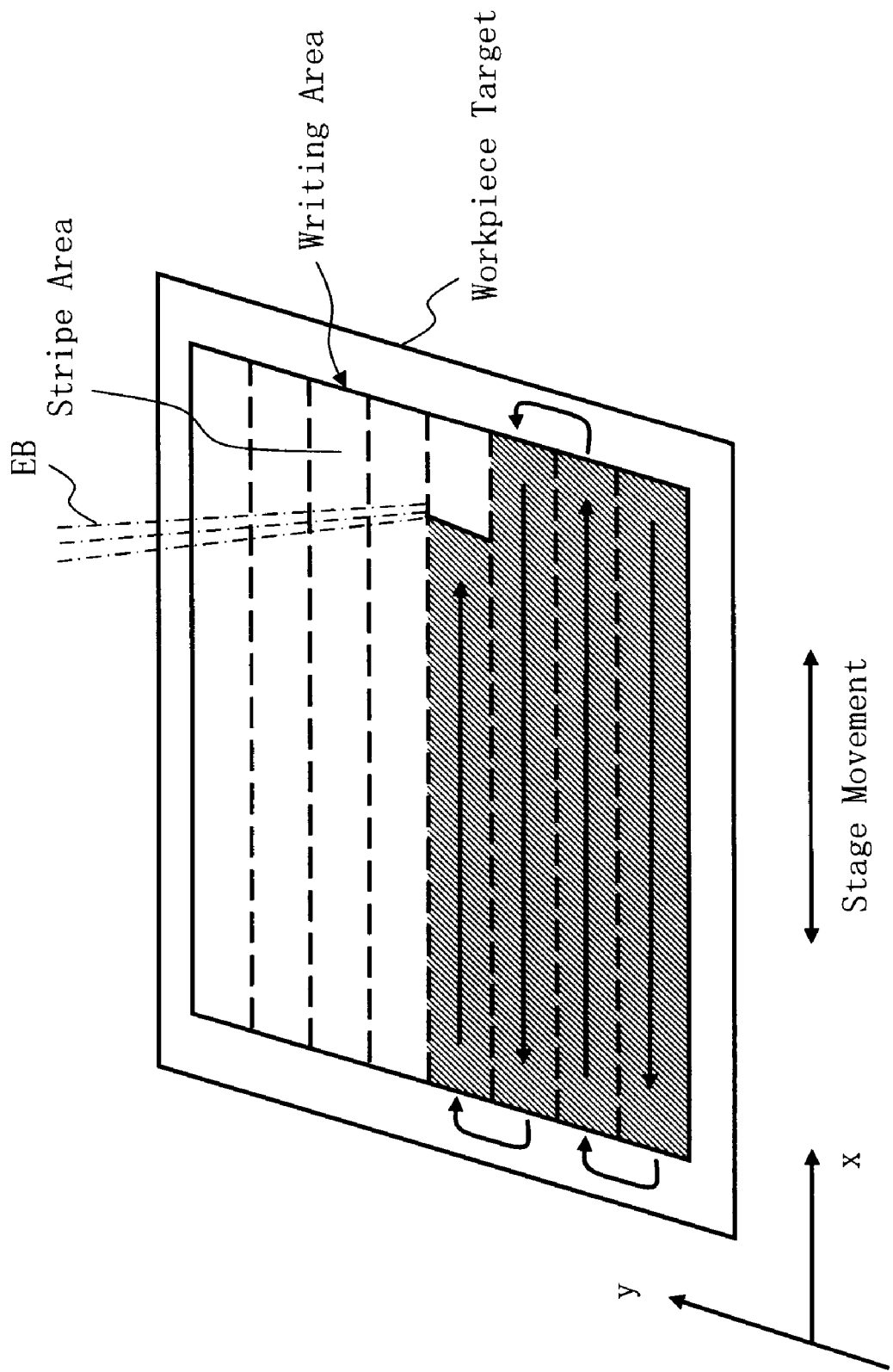
FIG. 3 shows a state for explaining a stage movement described in Embodiment 1.

FIG. 3 shows a state for explaining a stage movement described in Embodiment 1. When performing writing on the target workpiece 101, the electron beam 200 is irradiated on the writing area while the XY stage 105 continuously moving in the X direction, for example. The writing (exposure) surface of the target workpiece 101 is virtually divided into a plurality of strip-like stripe areas wherein the electron beam 200 can be deflected. The electron beam 200 irradiates one of the stripe areas. The movement of the XY stage 105 in the X direction is a continuous movement, for example. Simultaneously, the shot position of the electron beam 200 is made to be in accordance with the movement of the stage. Writing time can be shortened by performing the continuous movement. After finishing writing one stripe area, the XY stage 105 is moved in the Y direction by step feeding. Then, the writing operation of the next stripe area is performed in the X direction (reverse direction). By performing the writing operation of each stripe area in a zigzag manner, the movement time of the XY stage 105 can be shortened.

Therefore, in order for the pattern writing apparatus 100 to write a figure pattern of each chip area included in the layout data 152, the writing area needs to be virtually divided into drawing frame (writing frame) areas (the stripe area mentioned above) anew for the pattern writing apparatus 100 to draw. In this case, after performing a merge process of a plurality of chips included in the layout data 152, the writing area is virtually divided into drawing frame areas (the stripe area mentioned above). Moreover, the layout data 152 is converted to writing data for the pattern writing apparatus 100 to write, and further, it is converted to shot data to actually execute a shot.

Figure 4:
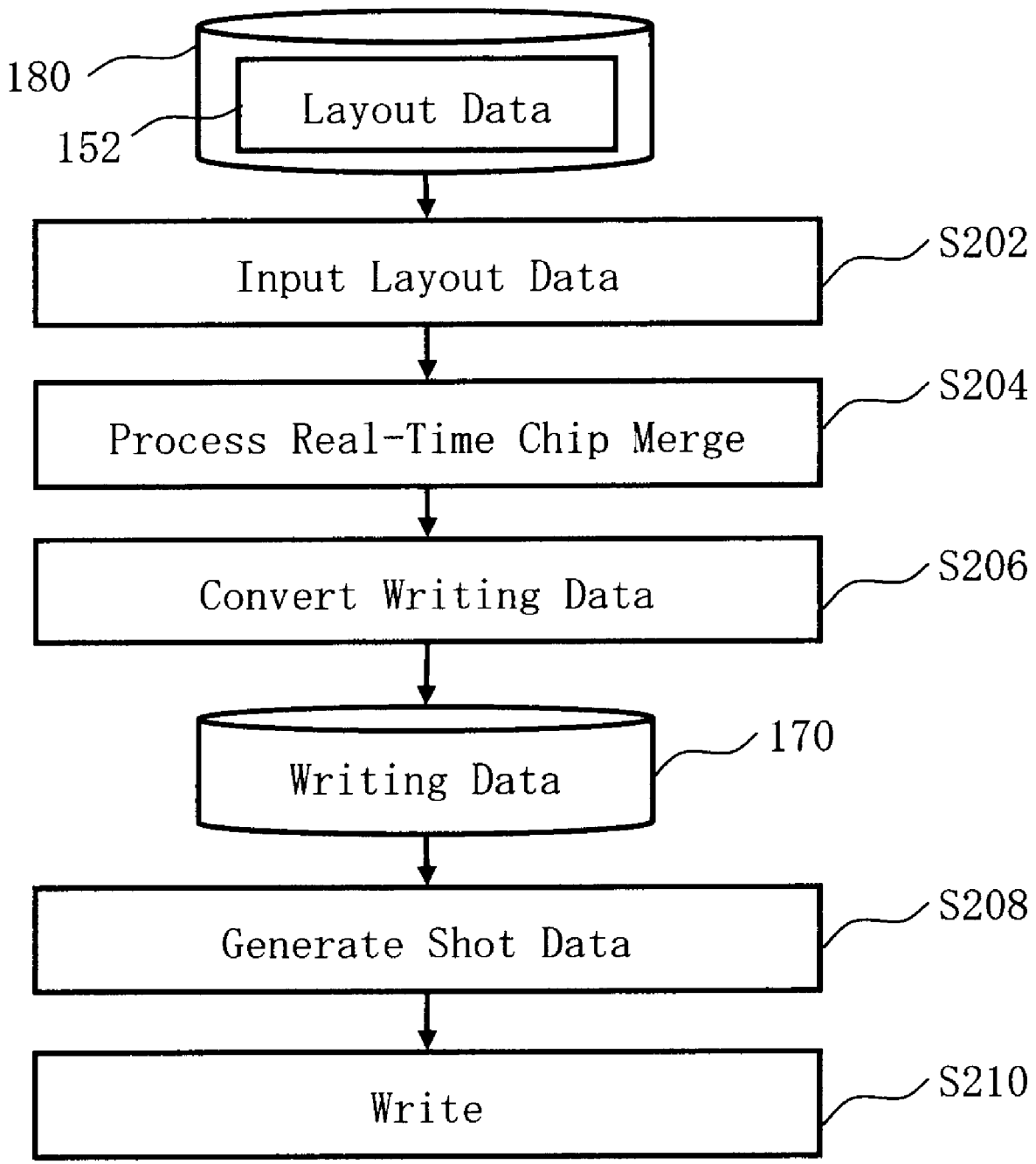
FIG. 4 is a flowchart showing main steps of the flow up to writing described in Embodiment 1.

FIG. 4 is a flowchart showing main steps of the flow up to writing described in Embodiment 1. In the figure, according to the drawing method of Embodiment 1, a series of steps of a layout data input step (S202), a real-time chip merge (RTCM) process step (S204), a writing data conversion step (S206), a shot data generation step (S208), and a writing step (S210) is executed.

First, under the control of the processing management part 112, the PPU 182, the PPU 184, and the PPU 186 respectively reads the layout data 152 stored in the data storage unit 180, per frame unit of each chip, and inputs it (S202). Then, each processing unit of the PPU 182, the PPU 184 and the PPU 186 respectively performs a chip merge process of the data inputted by the parallel processing, in real time (S204). Moreover, each processing unit of the PPU 182, the PPU 184, and the PPU 186 respectively converts the data for which a chip merge process has been performed by the parallel processing into writing data, and outputs the converted data to the high-speed shared storage unit 170 (S206). In the high-speed shared storage unit 170 used as a buffer memory, the writing data which is converted one after another in real time is stored temporarily. Then, the data which has been read is deleted. When data for one drawing frame has been stored in the high-speed shared storage unit 170, the shot data generating unit 130 reads the writing data for one drawing frame from the high-speed shared storage unit 170, and generates shot data (S208). Then, based on the generated shot data, the deflection control circuit 140 controls the deflector 205 through the DAC 142 in order to change the shape and the size of the beam. Moreover, the deflection control circuit 140 controls the deflector 208 through the DAC 144 in order to irradiate the electron beam 200 onto a desired position of the target workpiece 101 on the XY stage 105 (S210).

During the process from inputting the layout data to writing in the pattern writing apparatus 100 as stated above, operation errors of the functions may occur: a writing data conversion error may be generated by each processing unit of the PPU 182, the PPU 184, and the PPU 186; a shot data generation error may be generated by the shot data generating unit 130; a deflection control error may be generated by the deflection control circuit 140 when actually performing drawing; a tracking overflow may be generated by the stage drive circuit 210; etc. Moreover, as a writing error, in addition to the case the pattern writing apparatus 100 stops by the error generated by the software or hardware stated above, there is a case that an inspection apparatus detects a pattern error, etc. after the pattern writing apparatus 100 finished writing.

Then, according to the present Embodiment, it is structured to obtain the minimum data required for executing a reproduction test in order to shorten an inspection time when a writing error of the function of the pattern writing apparatus 100 occurs during the procedure from inputting the layout data 152 into the pattern writing apparatus 100 to inspecting the target workpiece 101 on which the figure pattern has been written. This minimum data indicates data of a predetermined range including the error point after the real-time chip merge process. In other words, a part of layout data required for the operation of the function having a writing error is extracted from the layout data 152 in which the writing error occurred. Then, based on the extracted part of the layout data, evaluation data is generated. The writing error of the pattern writing apparatus can be verified by reproducing the operation of the function having the writing error, by using the evaluation data.

By extracting a part of the layout data, not all of the layout data, data necessary for the operation having the writing error can be obtained even without performing the writing again from the start of the writing. Reproduction can be performed in a short time by reproducing the operation of the function having a writing error based on a part of the layout data.

Depending upon a point where a writing error occurred, minimum data necessary for reproducing the operation of the function becomes various. As to the examples mentioned above, for example, in the writing data conversion processing, what is necessary is figure data actually having the conversion error. For example, in the shot data generation processing, what is necessary is data for one drawing frame including the error point. Data for one drawing frame is enough for calculating a frame area in order to obtain a stage speed. Moreover, for example, in the deflection control processing when performing actual writing, what is necessary is data for one drawing frame including the error point. This is because, if an error arises at a deflection position during actually drawing, it becomes necessary to execute writing again for each drawing frame since the writing operation is performed while moving the XY stage 105 for each drawing frame (stripe) as stated above. Moreover, for example, in the case of a tracking overflow occurring, what is necessary is data for one drawing frame including the error point because the pattern area density is needed for calculating a stage speed. Moreover, for example, in the case of detecting a pattern error etc. by an inspection apparatus after the writing, what is needed is data for one drawing frame including the error point because it is necessary to execute the writing again per drawing frame unit.

Since the layout data 152 is hierarchically structured by a plurality of internal structure units, such as the layer of a chip, the layer of a frame, the layer of a block, the layer of a cell, and the layer of a figure, what is necessary is to extract required data including the operation error point from the layout data 152, per each of the plurality of internal structure units (a part of the layout data) in order to generate evaluation data. By reducing the data amount as small as possible, time spent for reproducing can be shortened.

Figure 5:
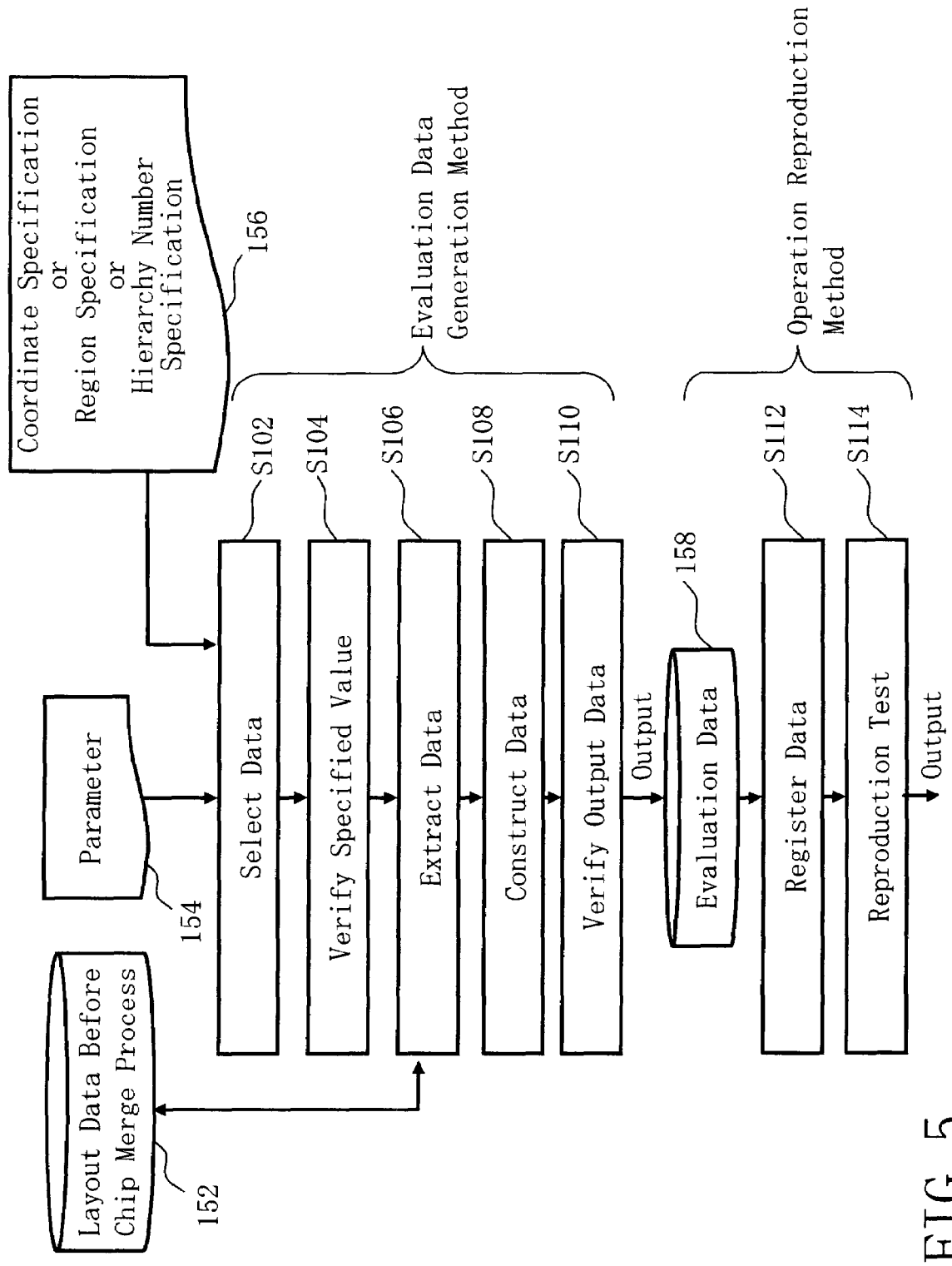
FIG. 5 is a flowchart showing main steps of an evaluation data generation method and an operation reproduction method described in Embodiment 1.

FIG. 5 is a flowchart showing main steps of the evaluation data generation method and the operation reproduction method described in Embodiment 1. In the figure, as the evaluation data generation method being an example of the generation method of the writing error verification data for the pattern writing apparatus, a series of steps of a data selection step (S102), a specified value verification step (S104), a data extraction step (S106), a data construction step (S108), and an output data verification step (S110) are executed. Then, using the outputted evaluation data, as the operation reproduction method, a series of steps of a data registration step (S112) and a reproduction test step (S114) are executed.

In S (step) 102, as the data selection step, the data selection part 122 inputs a predetermined parameter 154, and selects the layout data 152 for which a chip merge process has not been performed, stored in the data storage unit 180. Since there is a case that a plurality of layout data 152 is stored in the data storage unit 180, it needs to select appropriate layout data 152 required.

In S104, as the specified value verification step, the specified value verification part 124 inputs specification information 156 and verifies whether a specified value is appropriate or not. When the specified value is not appropriate, the step ends with outputting an error. As the specification information 156, for example, the following can be cited: coordinate specification information of a plurality of internal structure units, such as the layer of a chip, the layer of a frame, the layer of a block, the layer of a cell, and the layer of a figure; region specification information that specifies a predetermined region; and hierarchy number specification information (an example of identifier specification information) that specifies a hierarchy number (identifier) provided in each internal structure of a plurality of internal structure units, such as the layer of a chip, the layer of a frame, the layer of a block, the layer of a cell, and the layer of a figure, can be cited. By using at least one of the coordinate specification information, the region specification information, and the hierarchy number specification information, data needed for verifying an operation error is specified from the data included in the layout data 152. An example of the method of specifying data will be explained hereafter.

Figure 6:
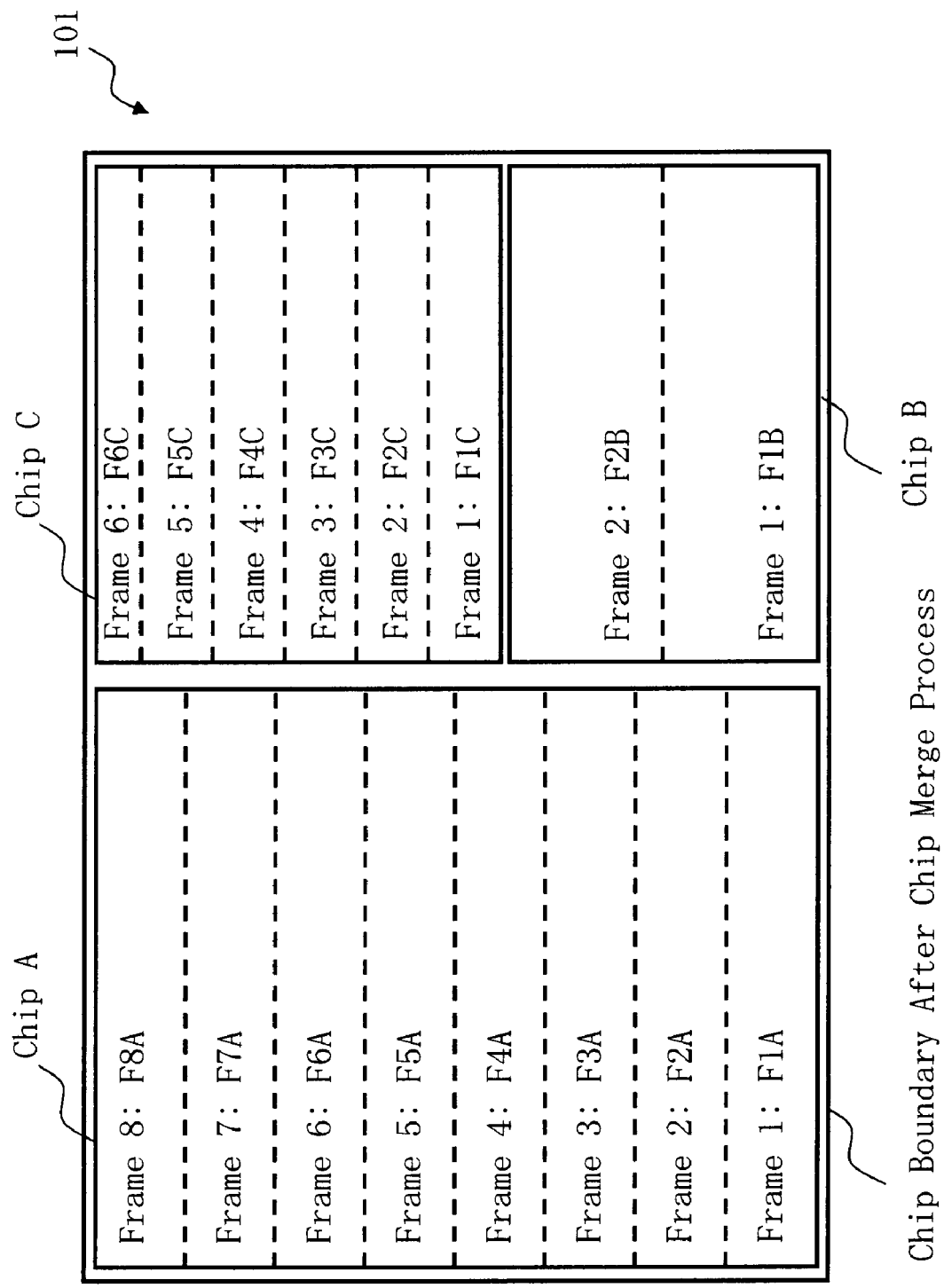
FIG. 6 is a schematic diagram showing an arrangement position of chips for which a chip merge process is to be performed described in Embodiment 1.

FIG. 6 is a schematic diagram showing an arrangement position of chips for which a chip merge process is to be performed described in Embodiment 1. In the layout data 152 shown in FIG. 6, Chip A, Chip B, and Chip C are arranged as an example. Chip A is composed of eight frames, from frame 1 (F1A) to frame 8 (F8A). Chip B is composed of two frames, frame 1 (F1B) and frame 2 (F2B). Chip C is composed of six frames, from frame 1 (F1C) to frame 6 (F6C). When executing writing, a chip merge process is performed for Chip A, Chip B, and Chip C to make them be one chip.

Figure 7:
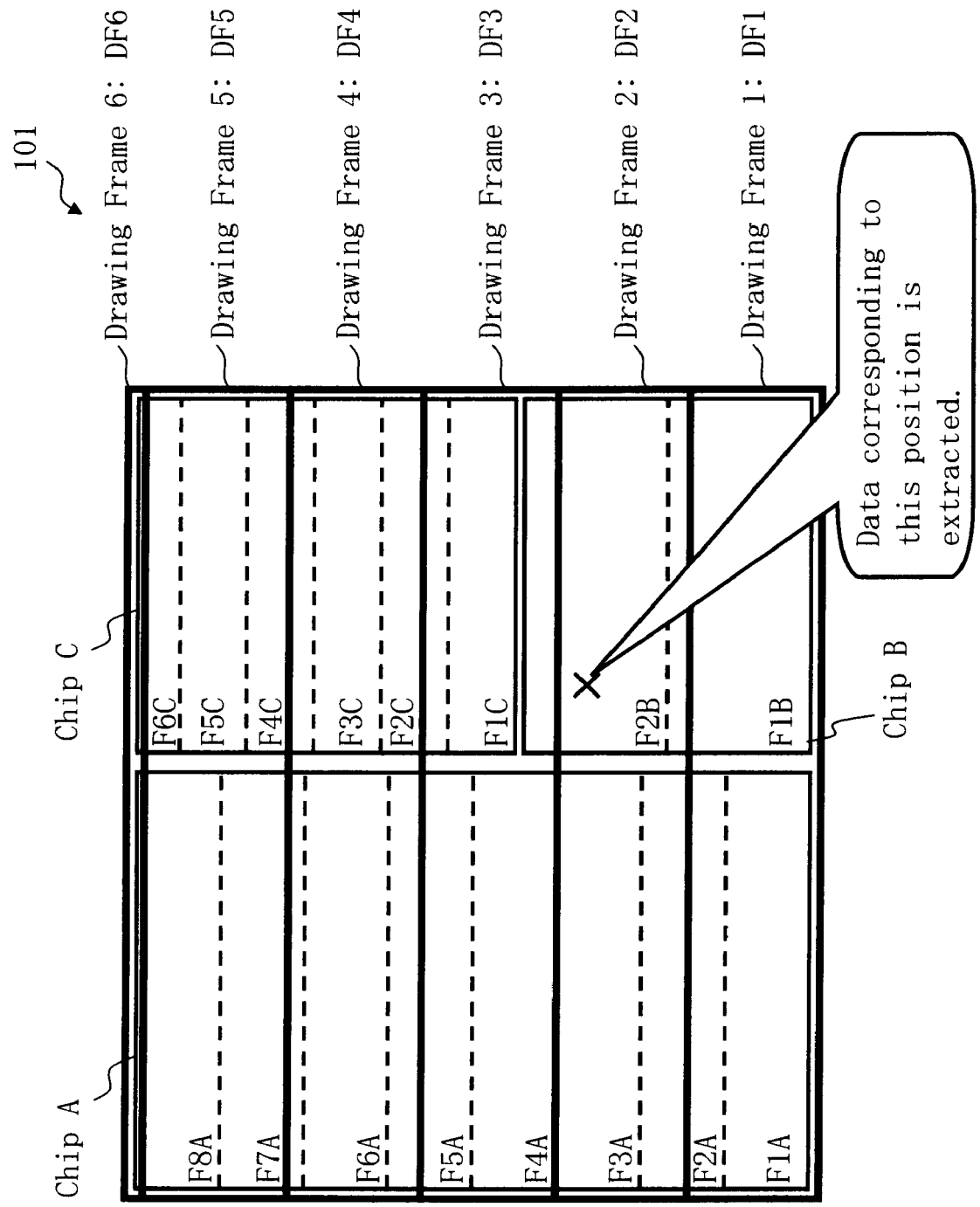
FIG. 7 is a schematic diagram showing an example of dividing a chip, for which a chip merge process has been performed, into drawing frames described in Embodiment 1.

FIG. 7 is a schematic diagram showing an example of dividing a chip, for which a chip merge process has been performed, into drawing frames described in Embodiment 1. FIG. 7 shows the case of dividing the chip, for which a chip merge process was performed as shown in FIG. 6, into six drawing frames, from drawing frame 1 (DF1) to drawing frame 6 (DF6). As mentioned above, the pattern writing apparatus 100 will perform writing per drawing frame. Now, for example, it is assumed that an error occurs at a position (denoted by X) in the drawing frame 2 (DF2).

First, as specification information, the case of performing coordinate specification (or point specification) that specifies a position (denoted by X in FIG. 7) where an error occurs by coordinates (or point) will be explained.

Figure 8:
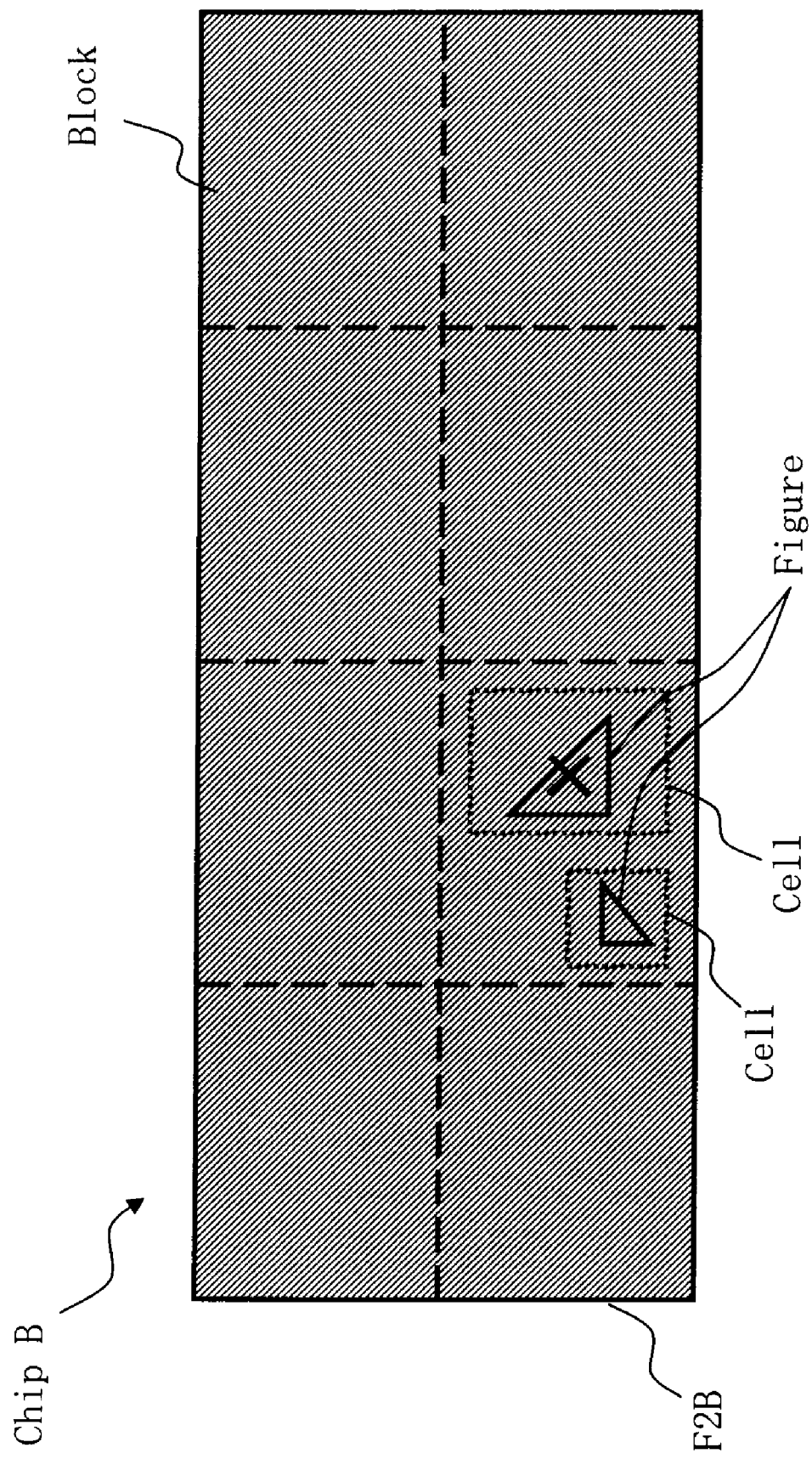
FIG. 8 is a schematic diagram showing an example that a whole frame specified by coordinate specification is extracted as an extraction object described in Embodiment 1.

FIG. 8 is a schematic diagram showing an example that a whole frame specified by coordinate specification is extracted as an extraction object described in Embodiment 1. FIG. 8 shows the case of extracting the whole frame including specified coordinates. In this case, since the specified coordinate position exists in the frame 2 (F2B) of Chip B, the frame 2 (F2B) of Chip B is shown as an extraction area, or "range".

Figure 9:
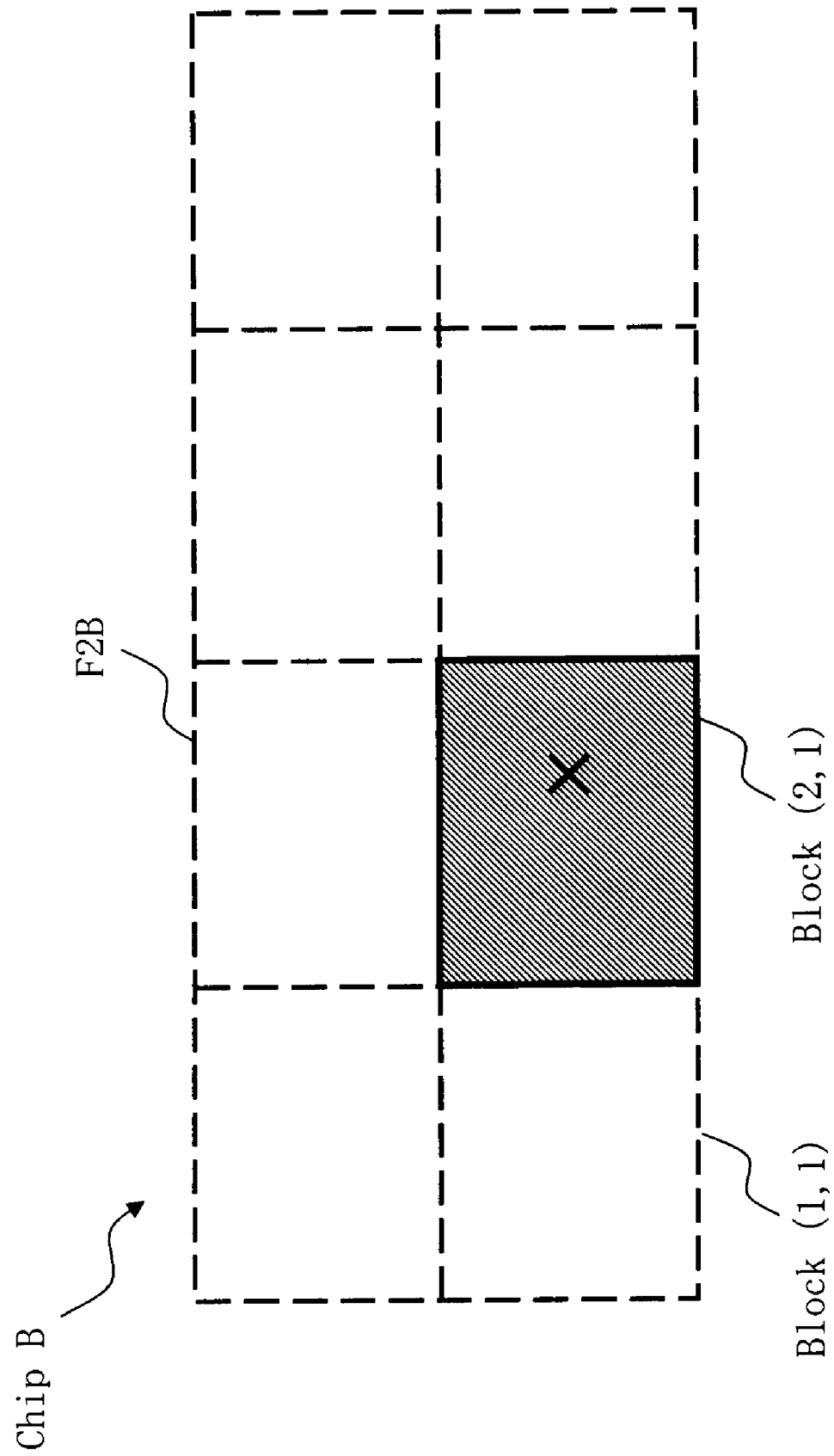
FIG. 9 is a schematic diagram showing an example that a block specified by coordinate specification is extracted as an extraction object described in Embodiment 1.

FIG. 9 is a schematic diagram showing an example that a block specified by coordinate specification is extracted as an extraction object described in Embodiment 1. FIG. 9 shows the case of extracting the block including specified coordinates. In this case, since the specified coordinate position exists in the block (2, 1) in the frame 2 (F2B) of Chip B, the block (2, 1) is shown as an extraction area.

Figure 10:
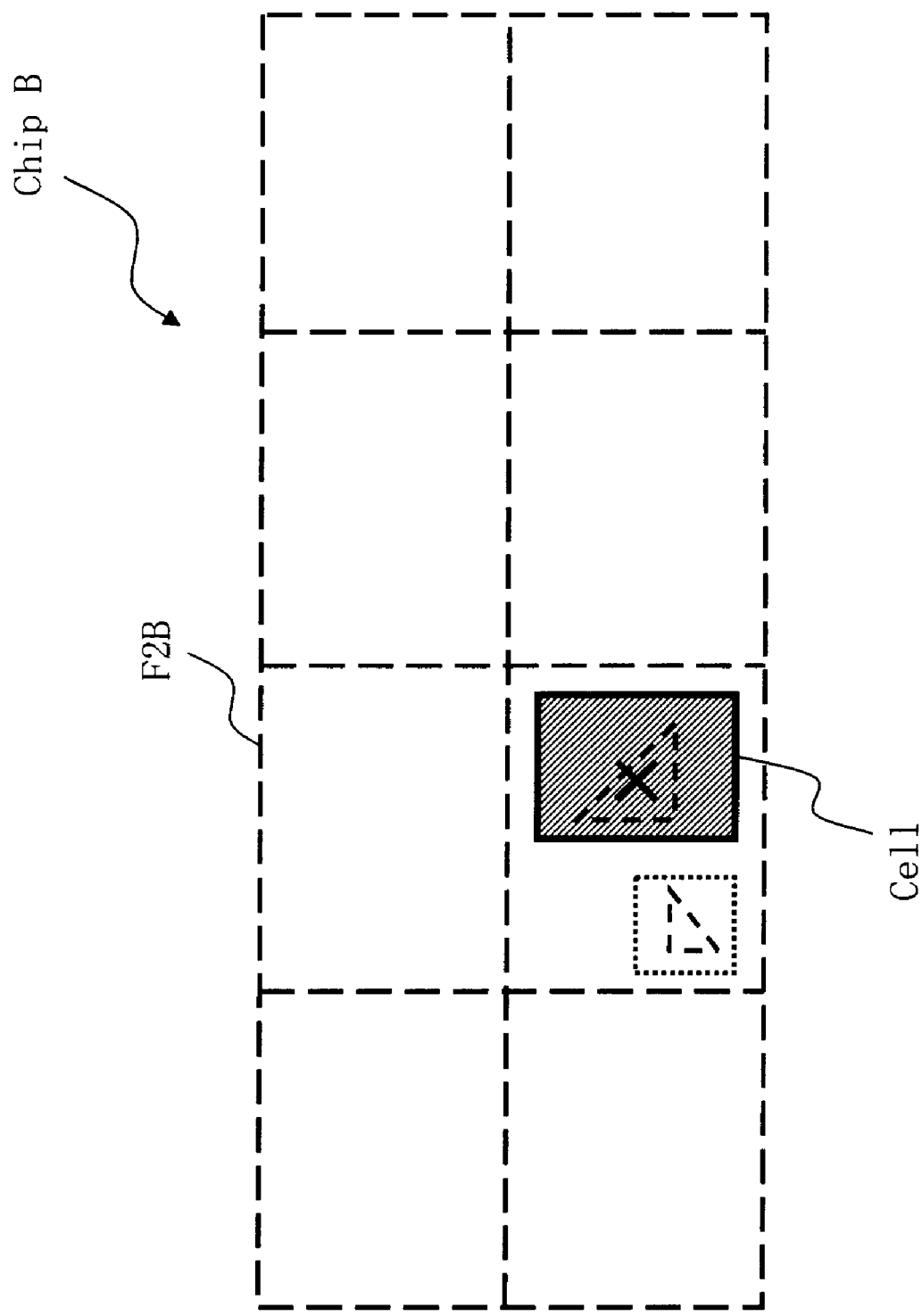
FIG. 10 is a schematic diagram showing an example that a cell specified by coordinate specification is extracted as an extraction object described in Embodiment 1.

FIG. 10 is a schematic diagram showing an example that a cell specified by coordinate specification is extracted as an extraction object described in Embodiment 1. FIG. 10 shows the case of extracting the cell including specified coordinates.

Figure 11:
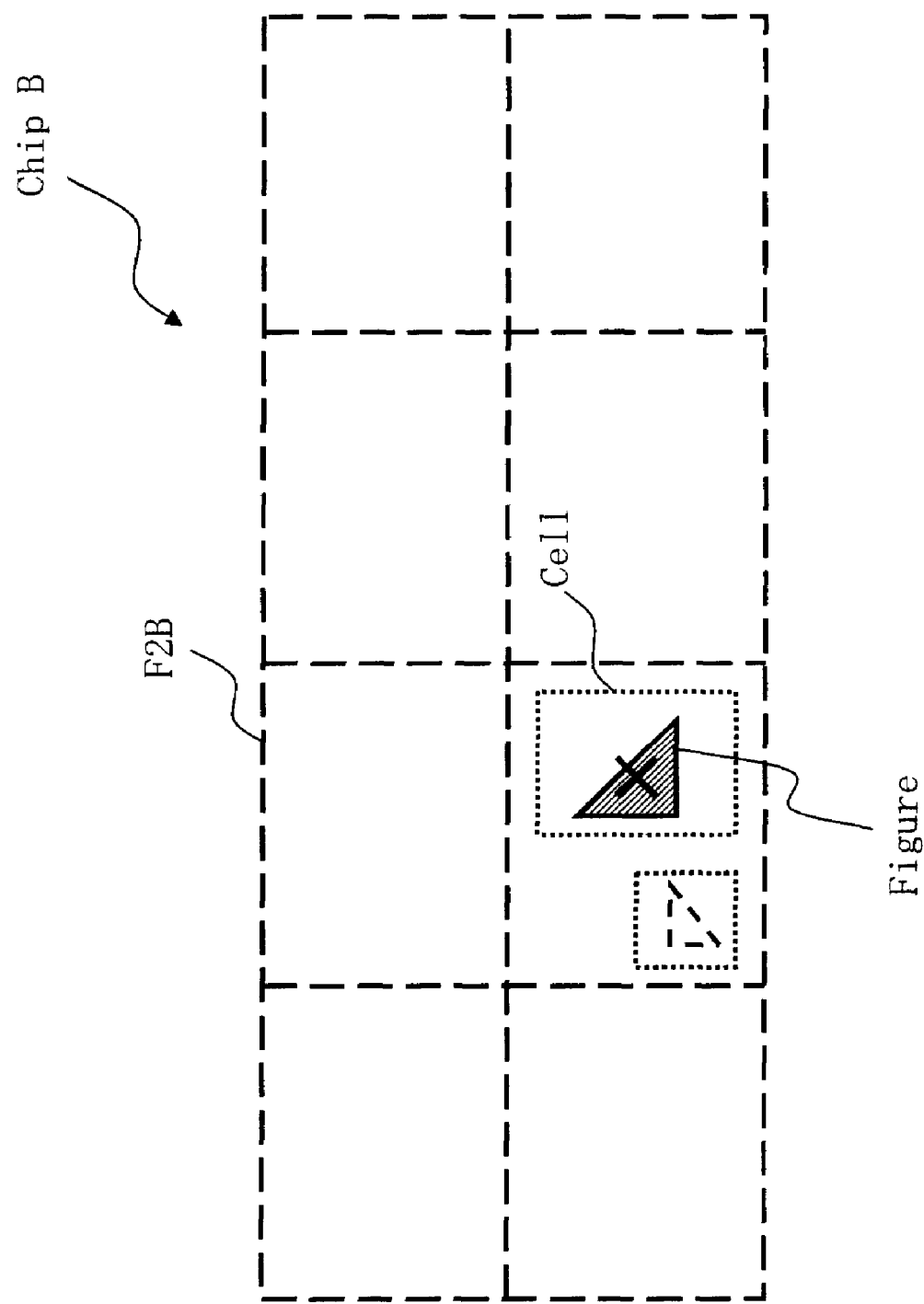
FIG. 11 is a schematic diagram showing an example that a figure specified by coordinate specification is extracted as an extraction object described in Embodiment 1.

FIG. 11 is a schematic diagram showing an example that a figure specified by coordinate specification is extracted as an extraction object described in Embodiment 1. FIG. 11 shows the case of extracting the figure including specified coordinates.

The cases described in FIGS. 8 to 11 are effective when data for one drawing frame is not necessary for verifying an operation error. Then, next, an example of the case of data for one drawing frame being necessary for verifying an operation error will be described.

Figure 12:
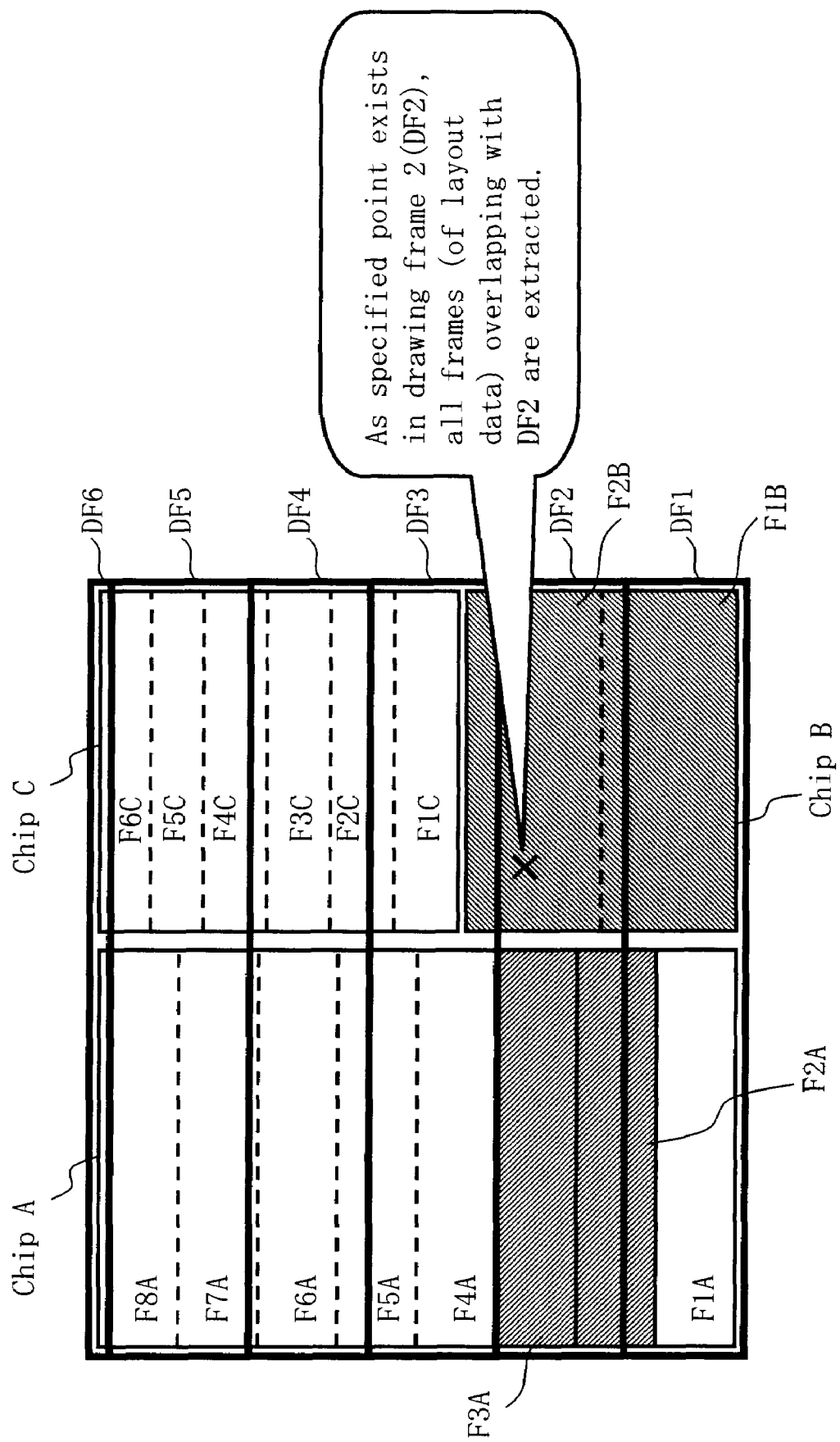
FIG. 12 is a schematic diagram showing an example that all the frames included in a drawing frame specified by coordinate specification are extracted as an extraction object described in Embodiment 1.

FIG. 12 is a schematic diagram showing an example that all the frames included in a drawing frame specified by coordinate specification are extracted as an extraction object described in Embodiment 1. In FIG. 12, frames of the chips, for which a chip merge process has not been performed yet, overlapping with the drawing frame including the specified coordinates are extracted even if the overlapping area, or "part" is very small. In this case, since the specified coordinate position exists in the drawing frame 2 (DF2), the frame 2 (F2A) and the frame 3 (F3A) of Chip A and the frame 1 (F1B) and frame 2 (F2B) of Chip B that are included in the area of the drawing frame 2 are extracted as an extraction area.

As to the range of the extraction area with respect to the specification coordinates as stated above, it may be set as a margin value in the parameter 154 (FIG. 5), for example.

Figure 13:
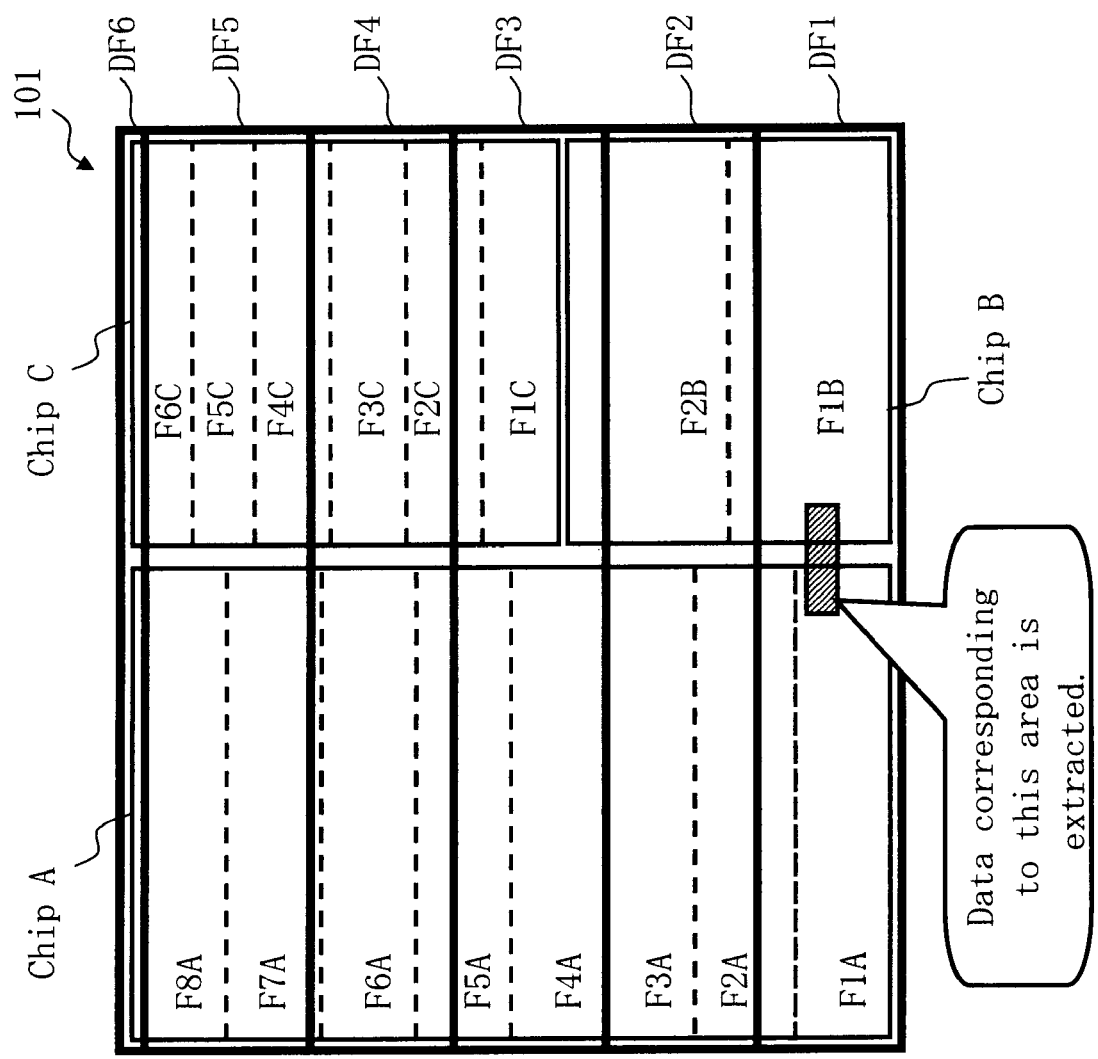
FIG. 13 is a schematic diagram showing an example that extraction is performed by region specification described in Embodiment 1.

Next, as shown in FIG. 13, the region (region (area) surrounded by a rectangle (or square) whose diagonal vertexes are coordinate positions) including the position where an error occurred is specified as specification information.

Figure 14:
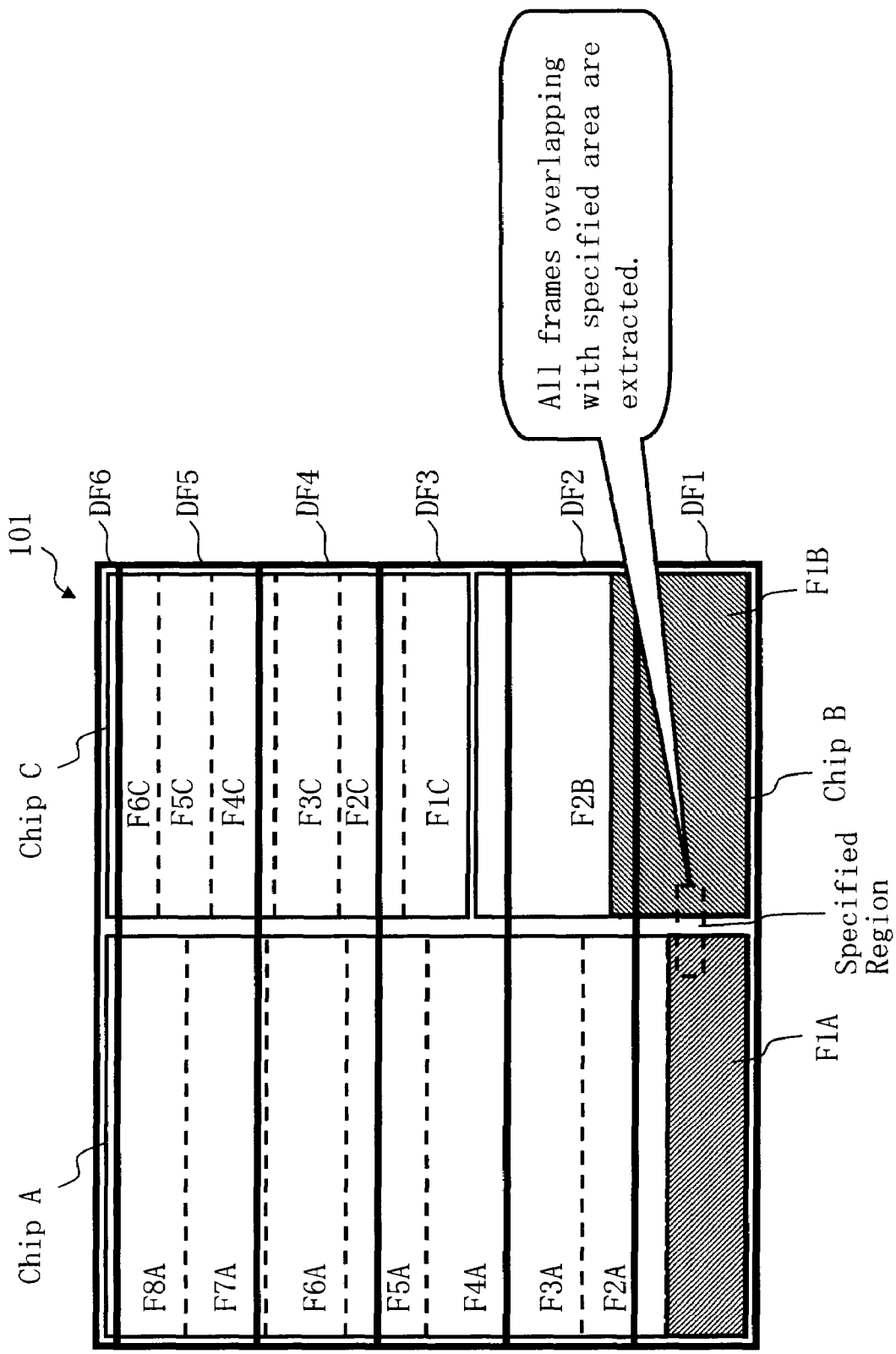
FIG. 14 is a schematic diagram showing an example that all the frames based on region specification are extracted as an extraction object described in Embodiment 1.

FIG. 14 is a schematic diagram showing an example that frames including the region specified by region specification are extracted as an extraction object described in Embodiment 1. FIG. 14 shows the case of extracting all the frames overlapping with the specified region even if the overlapping area is very small. In this case, since the specified region overlaps with the frame 1 (F1A) of Chip A and the frame 1 (F1B) of Chip B, the frame 1 (F1A) and the frame 1 (FIB) are extracted as an extraction area.

Figure 15:
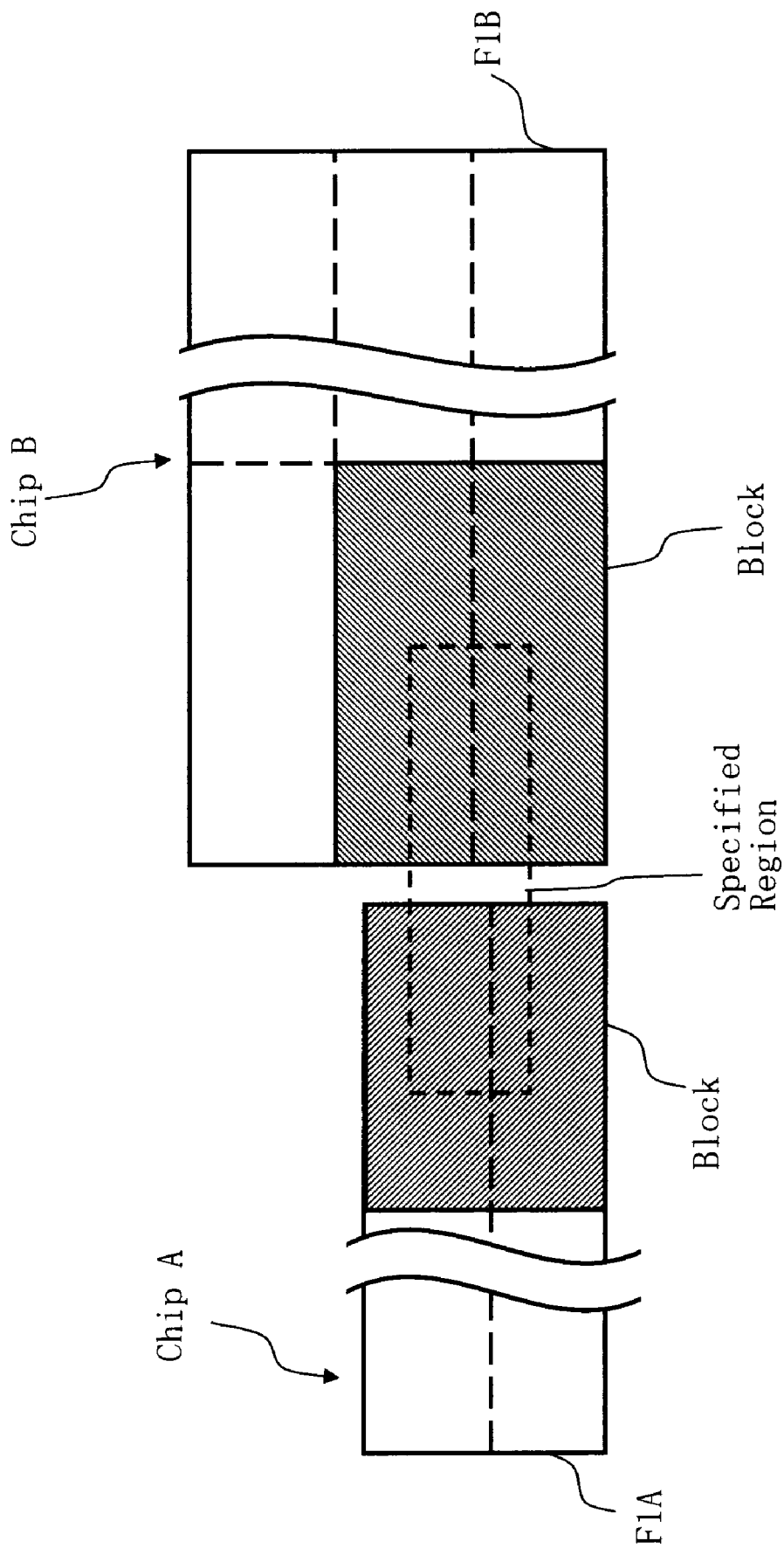
FIG. 15 is a schematic diagram showing an example that blocks based on region specification are extracted as an extraction object described in Embodiment 1.

FIG. 15 is a schematic diagram showing an example that blocks including the region specified by region specification are extracted as an extraction object described in Embodiment 1. FIG. 15 shows the case of extracting all the blocks overlapping with the specified region even if the overlapping area is very small. In this case, since the specified region overlaps with a block being a part of the frame 1 (F1A) of Chip A and a block being a part of the frame 1 (FIB) of Chip B, the block being a part of the frame 1 (F1A) and the block being a part of the frame 1 (FIB) are extracted as an extraction area.

Figure 16:
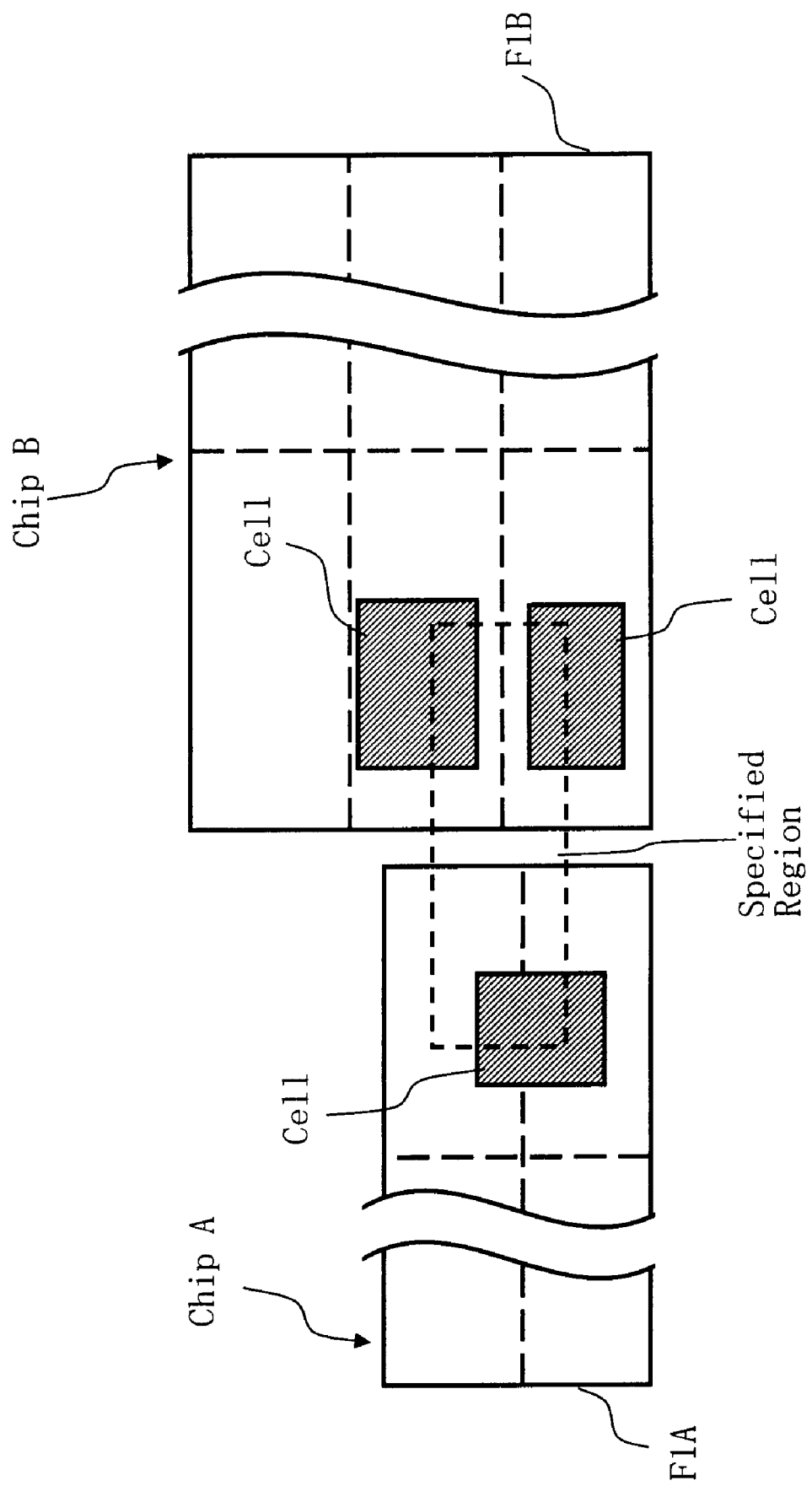
FIG. 16 is a schematic diagram showing an example that cells based on region specification are extracted as an extraction object described in Embodiment 1.

FIG. 16 is a schematic diagram showing an example that cells including the region specified by region specification are extracted as an extraction object described in Embodiment 1. FIG. 16 shows the case of extracting all the cells overlapping with the specified region even if the overlapping area is very small.

Figure 17:
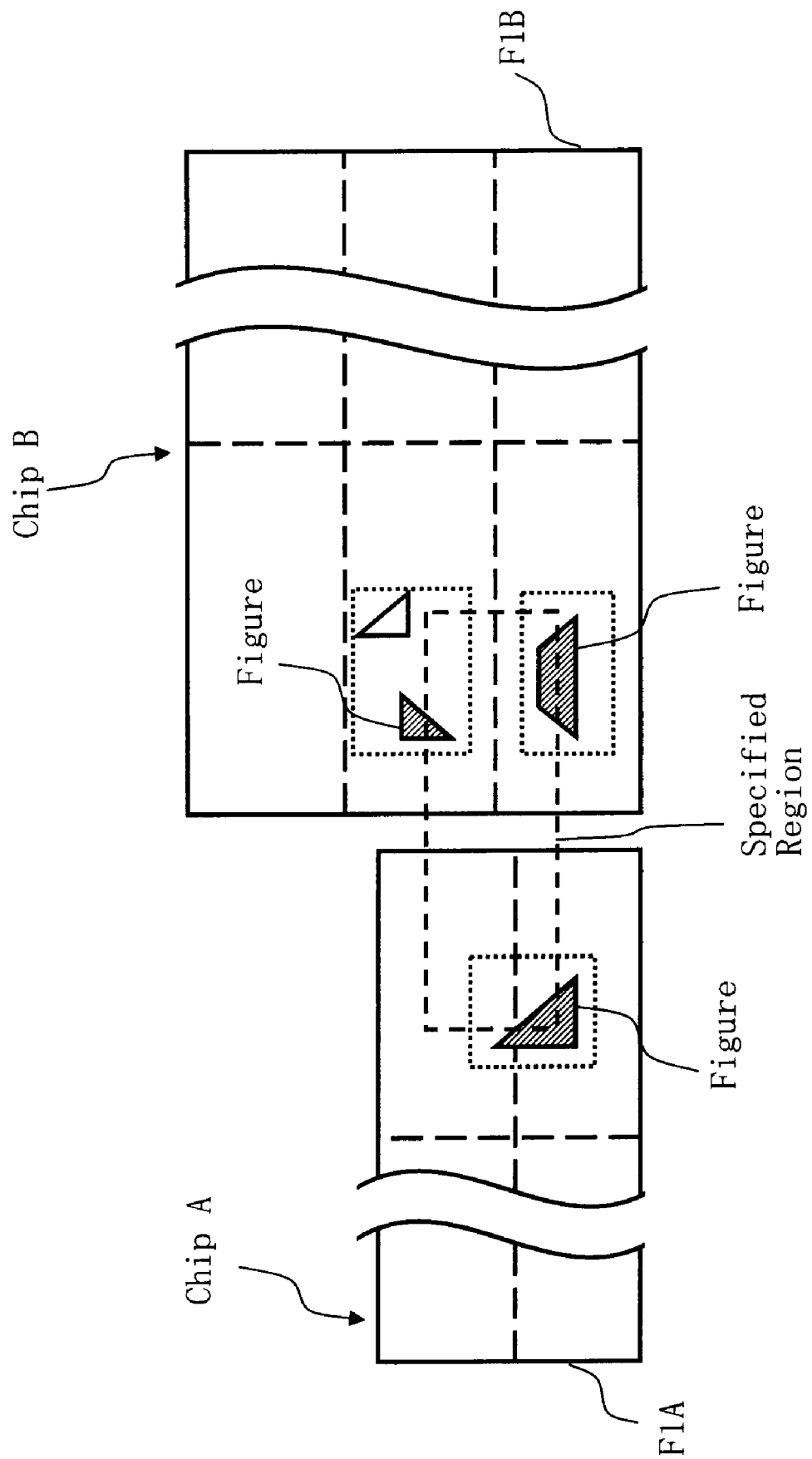
FIG. 17 is a schematic diagram showing an example that figures based on region specification are extracted as an extraction object described in Embodiment 1.

FIG. 17 is a schematic diagram showing an example that figures including the region specified by region specification are extracted as an extraction object described in Embodiment 1. FIG. 17 shows the case of extracting all the figures overlapping with the specified region even if the overlapping area is very small.

The cases described in FIGS. 15 to 17 are effective when data for one drawing frame is not necessary for verifying an operation error. Then, next, an example of the case of data for one drawing frame being necessary for verifying an operation error will be described.

Figure 18:
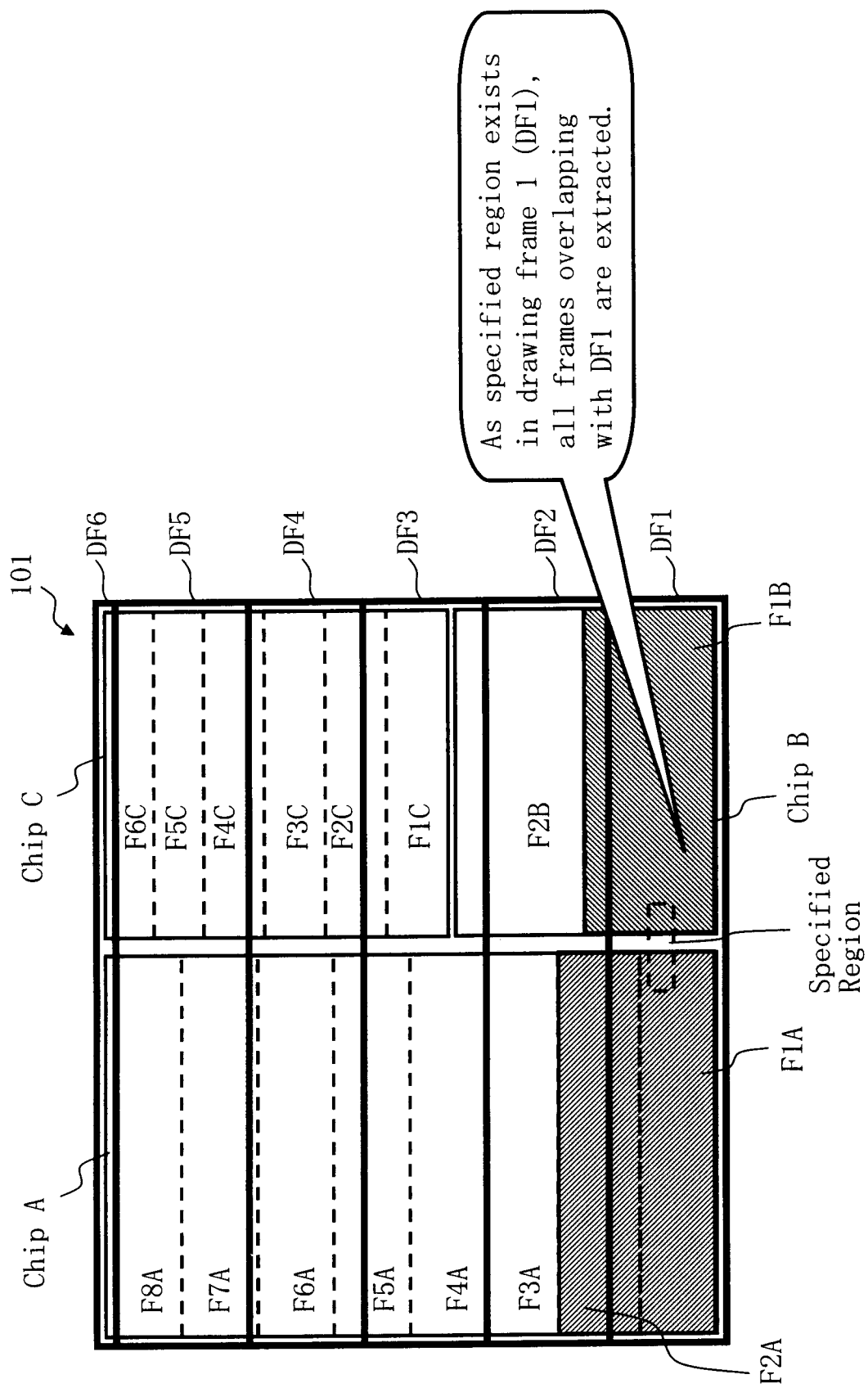
FIG. 18 is a schematic diagram showing an example that all the frames included in a drawing frame specified by region specification are extracted as an extraction object described in Embodiment 1.

FIG. 18 is a schematic diagram showing an example that all the frames included in a drawing frame specified by region specification are extracted as an extraction object described in Embodiment 1. In FIG. 18, frames of the chips, for which a chip merge process has not been performed yet, overlapping with the drawing frame including the specified region are extracted even if the overlapping area is very small. In this case, since the specified region exists in the drawing frame 1 (DF1), the frame 1 (F1A) and the frame 2 (F2A) of Chip A and the frame 1 (F1B) of Chip B that are included in the area of the drawing frame 1 are extracted as an extraction area.

As to the range of the extraction area with respect to the region coordinates as stated above, for example, it may be set as a margin value in the parameter 154 as stated above. For example, when verifying a pattern error after writing, the region can be specified at the position visually checked, which is very convenient. Moreover, when there are two or more error points, the region specification can be collectively performed, which is preferable.

Next, as specification information, the case of hierarchy number specification that performs specification by using a specific hierarchy number (an example of an identifier) or a name (an example of the identifier) of a certain internal structure including a position where an error occurred will be explained. For example, identifiers, such as a drawing frame number, a block number, a cell number, and a figure number in writing data can be used. The layout data 152 is hierarchically classified into a plurality of internal structure units, such as the layer of a chip, the layer of a frame, the layer of a block, the layer of a cell, and the layer of a figure as stated above. Besides, writing data for which a chip merge process and a writing data conversion have been performed is similarly hierarchically classified into a plurality of internal structure units, such as the layer of a chip, the layer of a frame, the layer of a block, the layer of a cell, and the layer of a figure. Then, each internal structure of the writing data, for which a chip merge process and a writing data conversion have been performed, is newly given a number and a name that are different from a number and a name of each internal structure of the layout data. In the present embodiment, using a specific hierarchy number, etc. of an internal structure of the writing data, data to be required in the layout data 152 is specified.

Figure 19:
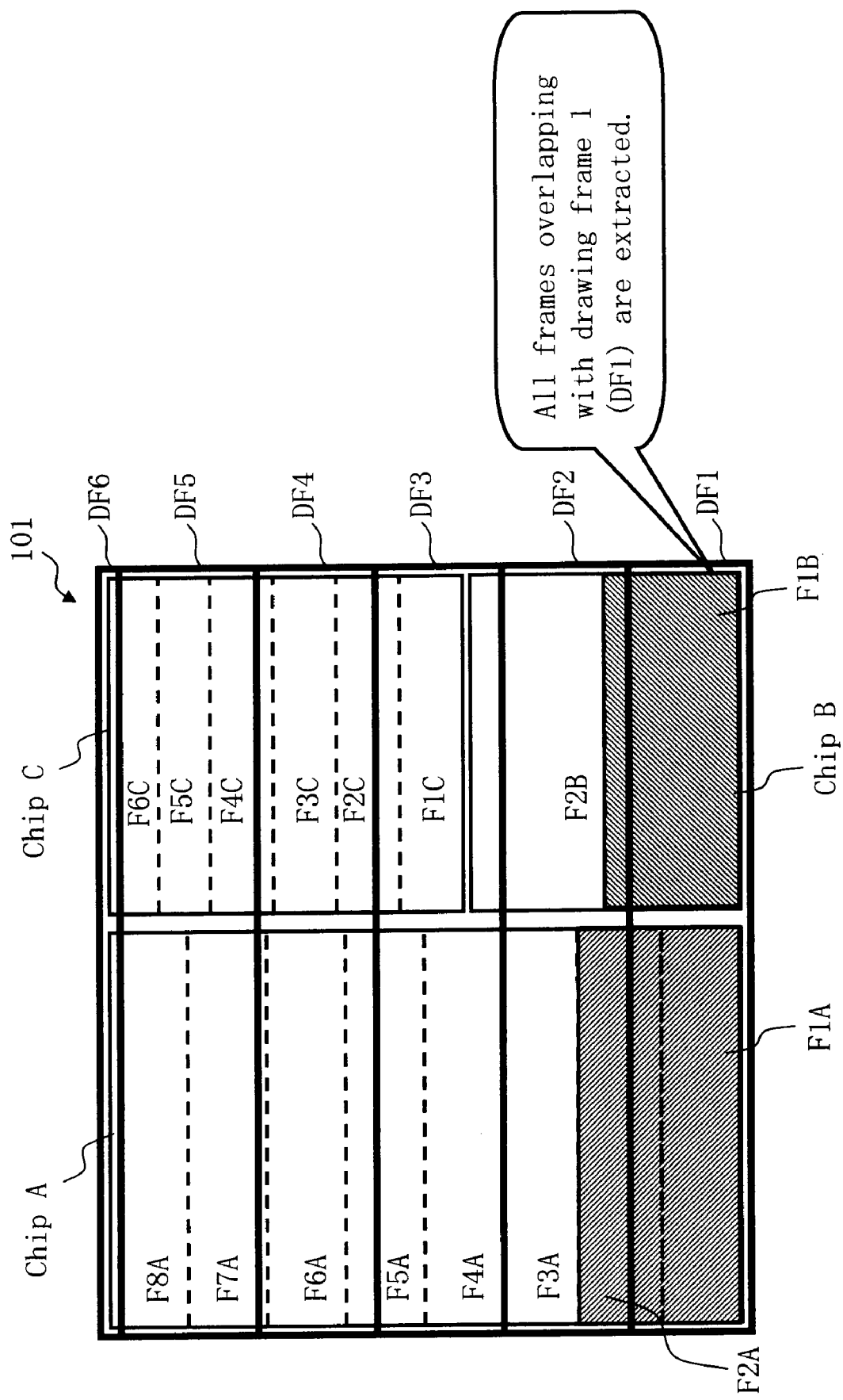
FIG. 19 is a schematic diagram showing an example that all the frames overlapping with a drawing frame specified by hierarchy number specification are extracted as an extraction object described in Embodiment 1.

FIG. 19 is a schematic diagram showing an example that all the frames overlapping with a drawing frame specified by hierarchy number specification are extracted as an extraction object described in Embodiment 1. In FIG. 19, frames of the chips, for which a chip merge process has not been performed yet, overlapping with the drawing frame specified by hierarchy number specification are extracted even if the overlapping area is very small. In this case, since the specified hierarchy number designates the drawing frame 1 (DF1), the frame 1 (F1A) and the frame 2 (F2A) of Chip A and the frame 1 (F1B) of Chip B that overlap with the drawing frame 1 are extracted as an extraction area even if the overlapping area is very small.

Figure 20:
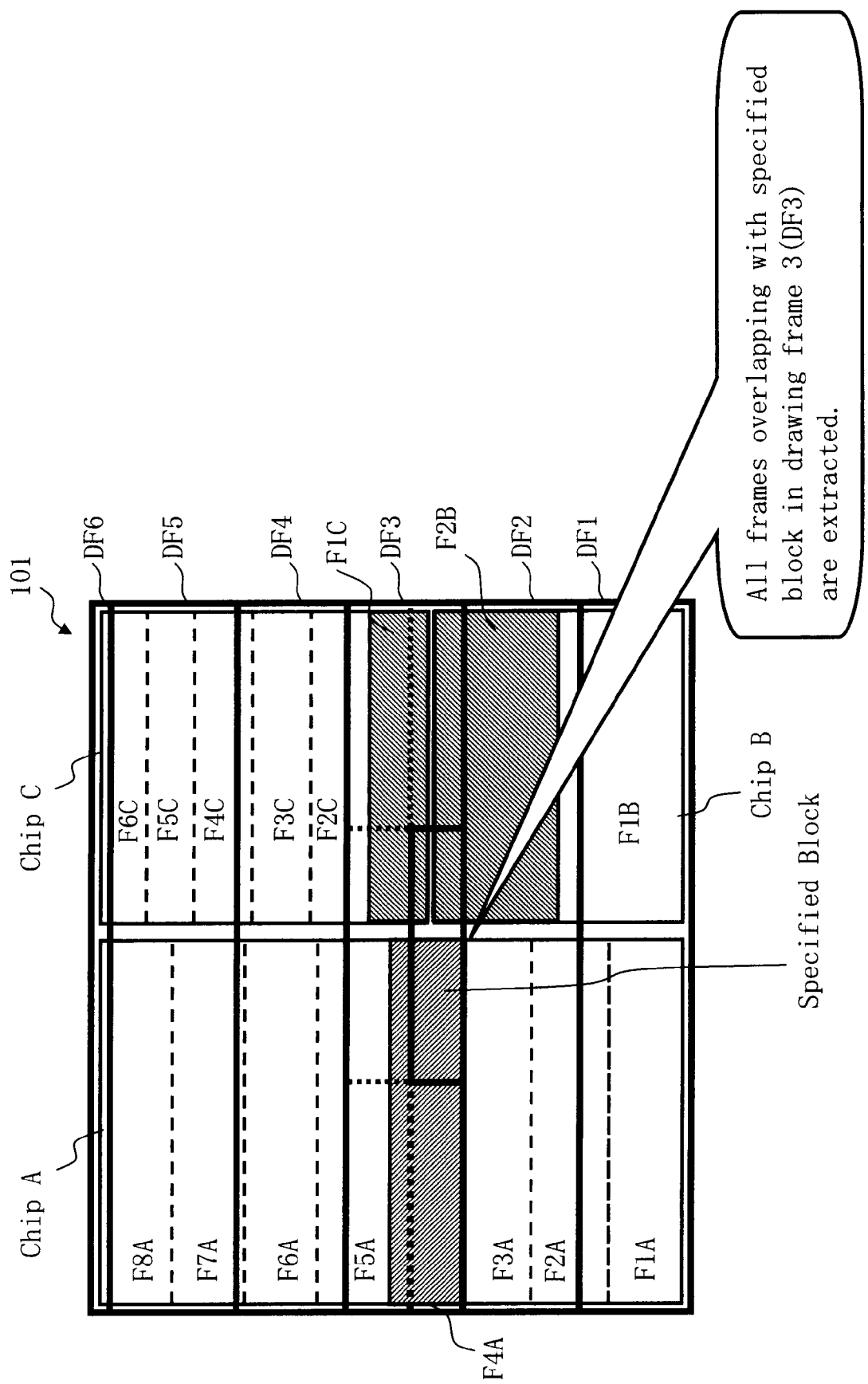
FIG. 20 is a schematic diagram showing an example that all the frames overlapping with a block specified by hierarchy number specification are extracted as an extraction object described in Embodiment 1.

FIG. 20 is a schematic diagram showing an example that all the frames overlapping with a block specified by hierarchy number specification are extracted as an extraction object described in Embodiment 1. In FIG. 20, frames of the chips, for which a chip merge process has not been performed yet, overlapping with the block in the writing data specified by hierarchy number specification, are extracted even if the overlapping area is very small. In this case, since the specified hierarchy number designates a specified block in the drawing frame 3 (DF3), the frame 4 (F4A) of Chip A, the frame 2 (F2B) of Chip B, and the frame 1 (F1C) of Chip C that overlap with the specified block are extracted as an extraction area even if the overlapping area is very small.

Figure 21:
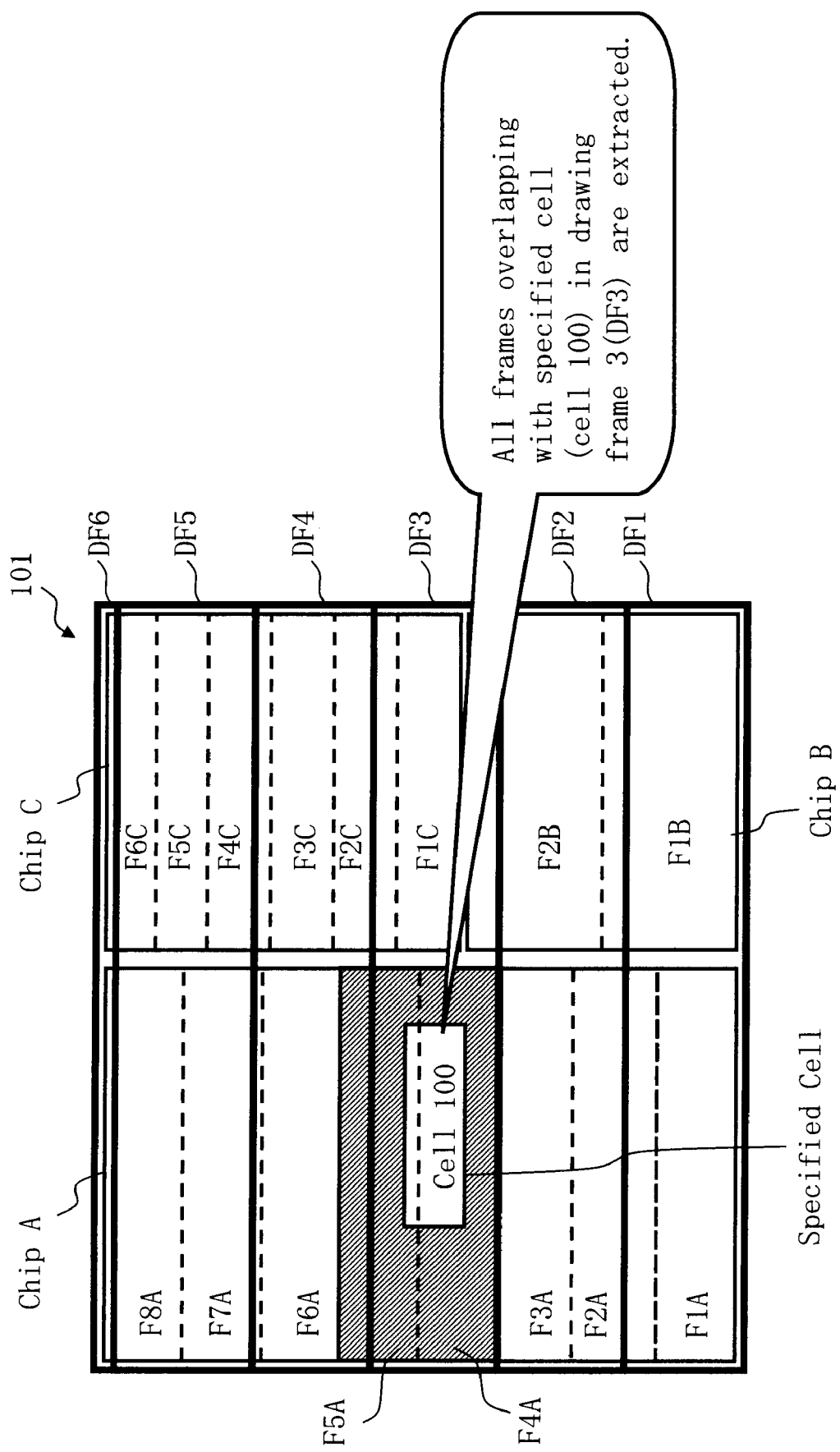
FIG. 21 is a schematic diagram showing an example that all the frames overlapping with a cell specified by hierarchy number specification are extracted as an extraction object described in Embodiment 1.
Figure 22:
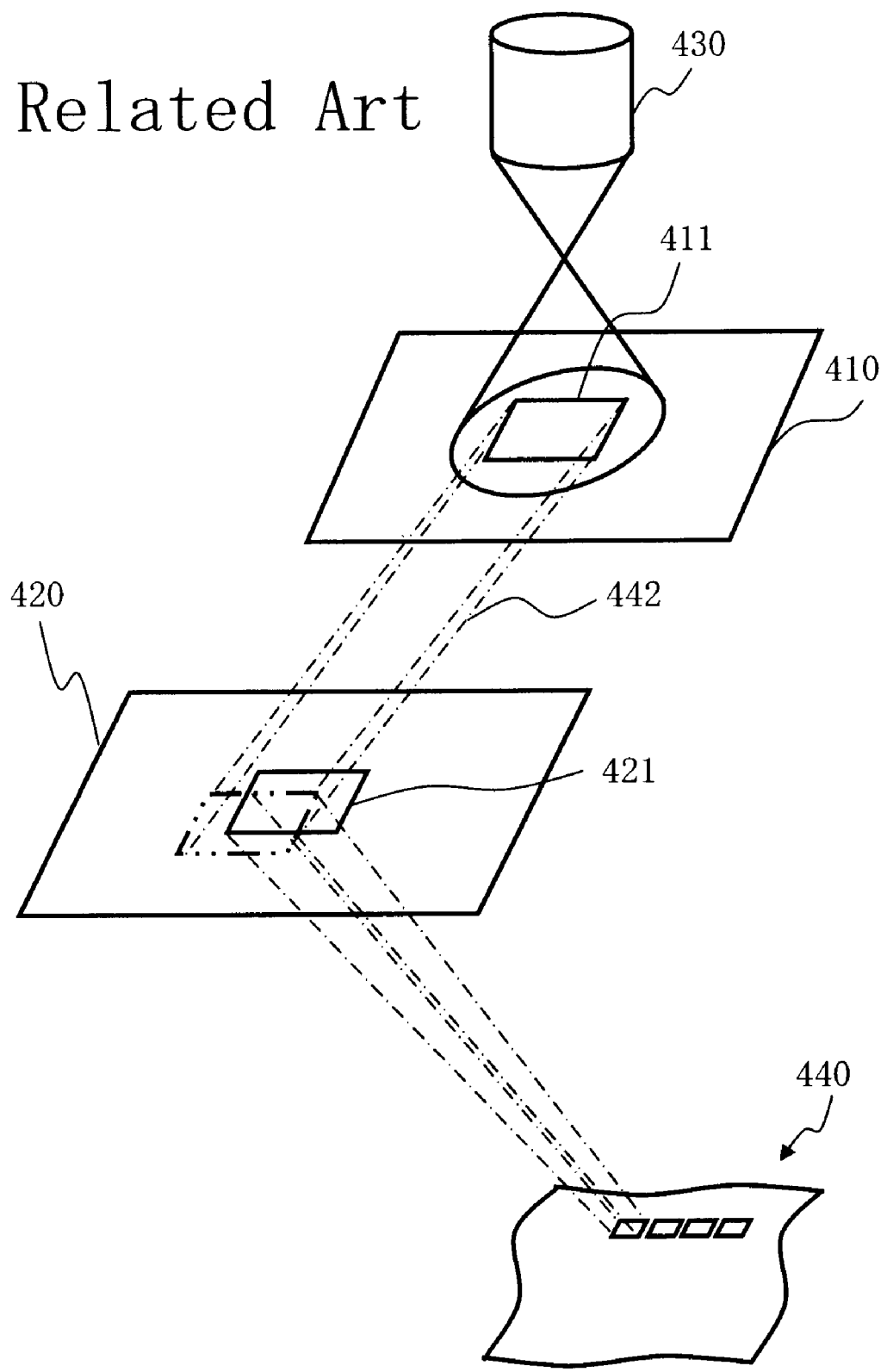
FIG. 22 shows a schematic diagram for explaining operations of a conventional variable-shaped electron beam pattern writing apparatus.

FIG. 21 is a schematic diagram showing an example that all the frames overlapping with a cell specified by hierarchy number specification are extracted as an extraction object described in Embodiment 1. In FIG. 21, frames of the chips, for which a chip merge process has not been performed yet, overlapping with the cell in the writing data specified by hierarchy number specification, are extracted even if the overlapping area is very small. In this case, since the specified hierarchy number designates a specified cell (cell 100) in the drawing frame 3 (DF3), the frame 4 (F4A) and the frame 5 (F5A) of Chip A that overlap with the specified cell are extracted as an extraction area even if the overlapping area is very small.

FIGS. 19 to 21 show the cases of performing extraction per frame in the layout data 152. Besides, as mentioned above, extraction can also be performed per internal structure element, such as the layer of a block, the layer of a cell, or the layer of a figure in the layout data 152. As to the range of the extraction area with respect to the hierarchy number specification as stated above, it may be set as a margin value in the parameter 154, for example.

In S106, as the data extraction step, when a specified value based on the specification information 156 is found to be appropriate after the verification, the data extraction part 126 extracts data of a predetermined range being a part of layout data required for the operation having an operation error, from the layout data 152 stored in the data storage unit 180, based on the specification information 156 and the margin value which has been set.

As mentioned above, by extracting a part of the layout data, data necessary for the operation having the writing error can be obtained even without performing the writing again from the start of the writing. However, since a merge process of the chips of the layout data has not been executed yet, the subsequent processing cannot be performed. Then, next, a merge process is executed using the extracted layout data, namely a part of the layout data, and writing error verification data, having been merged, for the pattern writing apparatus is generated. Thus, it becomes possible to smoothly forward the data to the processing function where the writing error occurred.

In S108, as the data construction step, the data construction part 128 serving as an example of a verification data generation part reconstructs the layout data by performing a chip merge process of the extracted data, and generates evaluation data 158 used as the operation error verification data of the pattern writing apparatus 100. Then, as to the data part which has not been extracted, it can be treated as null data indicating no data exists.

In S110, as the output data verification step, the output data verification part 132 verifies validation of the generated evaluation data 158. For example, it is verified whether the data format is appropriate or not. Then, the evaluation data 158 is output to an output position which was set in the parameter 154 in advance. Simultaneously, a log file concerning the generation of the evaluation data, given a log file name that was previously set in the parameter 154, is output to a log file output position that was set beforehand in the parameter 154.

The evaluation data generation part 120 is arranged in the writing control unit 110, however, it is not limited thereto. That is, as long as the evaluation data generation part 120 has a structure capable of accessing the data storage unit 180, it can be arranged anywhere. For example, it may be arranged exterior to the pattern writing apparatus 100.

Then, the operation of the pattern writing apparatus 100 is reproduced using the outputted evaluation data 158. In S112, as the data registration step, the processing management part 112 registers the evaluation data 158 output from the evaluation data generation part 120.

In S114, as the reproduction test step, the operation of the function having an operation error is reproduced, and the result of the reproduction is output.

As mentioned above, according to Embodiment 1, a writing error occurred after starting writing by the pattern writing apparatus 100 for performing writing on the workpiece target 101 based on the layout data 152 including a figure pattern to be written is verified by using the generated evaluation data 158.

As mentioned above, since the evaluation data 158 is generated by collecting (extracting) only required portions (a part of the layout data 152) from the layout data 152, it is possible to reduce the consumption amount of disk media (e.g., a flexible disk, CD-ROM, DVD-ROM, a magnetic tape) in which the collected data is stored.

Moreover, since it is not necessary to collect all the layout data 152, the collection time can be reduced.

Moreover, when transferring data required to be verified at makers, such as a pattern writing apparatus maker, by FTP (File Transfer Protocol) etc., since it is not necessary to transmit all the layout data 152, the transfer time can be shortened.

Furthermore, when generating the evaluation data 158, since it is enough to convert data of only a certain local area, MTTR (Mean Time to Repair: average repair time) can be reduced (i.e. debugging time can be shortened).

Furthermore, since the data of only a certain local area is disclosed, it is possible for the user side of the pattern writing apparatus to reduce risk of a data leak.

Processing contents and operation contents of what is represented by the word "part", "unit", or "step" in the above description can be configured by a computer-executable program. It may be executed by a software program, or alternatively by any combination of software, hardware and/or firmware. When configured by a program, the program is recordable or storable onto a recording medium, such as a magnetic disk drive, a magnetic tape drive, FD, and ROM (read-only memory). For example, it is recorded on a magnetic disk drive 146.

Moreover, in FIG. 1, when configuring the evaluation data generation part 120, the writing control unit 110, etc. by a control calculator being a computer, they may be connected, via a bus (not shown), to a RAM (Random Access Memory), a ROM, and a magnetic disk (HD) drive unit serving as examples of a storage device, a keyboard (K/B) and a mouse serving as examples of an input means, a monitor and a printer serving as examples of an output means, or an external interface (I/F), FD, DVD, CD, etc. serving as examples of an input/output means.

As mentioned above, the embodiments have been described with reference to concrete examples. However, the present invention is not limited to these concrete examples. For example, the contents of the present invention can be applied to a laser pattern writing apparatus which uses a laser to write a pattern on a target workpiece, in addition to the electron beam pattern writing apparatus mentioned above.

Moreover, although description of the apparatus structure, control methods, etc. not directly required for explaining the present invention is omitted, it is possible to suitably select and use some or all of them when needed. For example, while the structure of a control unit for controlling the pattern writing apparatus 100 is not described, it should be understood that necessary control unit structure can be appropriately selected and used.

In addition, any pattern writing apparatus, writing error verification method of a pattern writing apparatus, and generation apparatus of writing error verification data for a pattern writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A generation apparatus for writing error verification data for a pattern writing apparatus, the generation apparatus comprising:
   a data extraction part configured to extract, from layout data including a figure pattern to be written, part of the layout data required for an operation of a function having a writing error occurred after starting writing by the pattern writing apparatus which performs writing on a target workpiece based on the layout data; and
   a verification data generation part configured to perform a merge process based on the extracted part of the layout data, and to generate writing error verification data, for which the merge process has been performed, for verifying the writing error of the pattern writing apparatus.

2. The generation apparatus according to claim 1, further comprising:
   an input device configured to input specification information for specifying part of the layout data required for the operation of the function having the writing error,
   wherein the data extraction part extracts the part of the layout data specified by the specification information from the layout data.

3. The generation apparatus according to claim 2, wherein the layout data is hierarchically classified into a plurality of internal structure units, and each internal structure of the plurality of internal structure units is identified by an identifier, and
   at least one of coordinate information, region information and identifier information of the each internal structure is used as the specification information.

4. The generation apparatus according to claim 3, wherein a writing area of the target workpiece is virtually divided into a plurality of writing frames anew to be written by the pattern writing apparatus, and
   in the plurality of writing frames, data of a plurality of frames before virtually divided into the plurality of writing frames, overlapping with a writing frame at coordinates specified by the coordinate information, even if the overlapping is very small, is extracted as the part of the layout data.

5. The generation apparatus according to claim 3, wherein a writing area of the target workpiece is virtually divided into a plurality of writing frames anew to be written by the pattern writing apparatus, and
   in the plurality of writing frames, data of a plurality of frames before virtually divided into the plurality of writing frames, overlapping with a writing frame including an internal structure specified by the identifier information, even if the overlapping is very small, is extracted as the part of the layout data.

6. The generation apparatus according to claim 2, wherein data of a frame made by dividing a chip area into strip-like areas is extracted as the part of the layout data.

7. The generation apparatus according to claim 6, wherein data of a block made by dividing the frame is extracted as the part of the layout data.

8. The generation apparatus according to claim 2, wherein data of a cell composed of at least one figure is extracted as the part of the layout data.

9. The generation apparatus according to claim 2, wherein figure data is extracted as the part of the layout data.

10. A writing error verification method of a pattern writing apparatus, comprising:
    storing layout data in a data storage unit;
    inputting the layout data from the data storage unit;
    extracting part of the layout data required for an operation of a function having a writing error from the layout data, when the writing error occurs during a procedure from inputting the layout data, which includes a figure pattern to be written, into the pattern writing apparatus that writes the figure pattern on a target workpiece based on the layout data, for inspecting the target workpiece on which the figure pattern has been written; and
    reproducing the operation of the function having the writing error based on extracted part of the layout data, and outputting a result of the reproducing.

11. The writing error verification method according to claim 10, wherein the layout data is hierarchically classified into a plurality of internal structure units, and data of one of the plurality of internal structure units which includes a point of the writing error is extracted as the part of the layout data.

* * * * *